US012685224B2

(12) United States Patent
Ma et al.

(10) Patent No.: US 12,685,224 B2
(45) Date of Patent: Jul. 14, 2026

(54) ELECTRONIC DEVICES AND METHODS OF MANUFACTURING ELECTRONIC DEVICES

(71) Applicant: AMKOR TECHNOLOGY SINGAPORE HOLDING PTE. LTD., Singapore (SG)

(72) Inventors: Sang Yun Ma, Incheon (KR); Dong Hee Kang, Gyeonggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 575 days.

(21) Appl. No.: 18/190,885

(22) Filed: Mar. 27, 2023

(65) Prior Publication Data

US 2024/0332272 A1 Oct. 3, 2024

(51) Int. Cl.
*H10W 90/00* (2026.01)
*H10W 40/22* (2026.01)
(Continued)

(52) U.S. Cl.
CPC ........... *H10W 90/00* (2026.01); *H10W 40/22* (2026.01); *H10W 42/20* (2026.01); *H10W 70/68* (2026.01);
(Continued)

(58) Field of Classification Search
CPC ... H01L 25/165; H01L 23/13; H01L 23/3675; H01L 23/552; H01L 24/13; H01L 24/16; H01L 24/29; H01L 24/32; H01L 24/33; H01L 24/73; H01L 2224/13124; H01L 2224/13139; H01L 2224/13144; H01L 2224/13147; H01L 2224/13155; H01L 2224/13164; H01L 2224/13166; H01L 2224/13184; H01L 2224/16227; H01L 2224/2919; H01L 2224/29191; H01L 2224/32225; H01L 2224/32245; H01L 2224/33181; H01L 2224/73204; H01L 2224/73253; H01L 2924/0132; H01L 2924/0665; H01L 2924/069; H01L 2924/0695; H01L 2924/07025; H01L 2924/0715; H01L 23/3128; H01L 21/4817; H01L 21/56; H01L 23/481
See application file for complete search history.

(56) References Cited

U.S. PATENT DOCUMENTS 6,281,573 B1 8/2001 Atwood et al.
9,287,191 B2 3/2016 Liu et al.
(Continued)

*Primary Examiner* — Fernando L Toledo
*Assistant Examiner* — Shawn Shaw Muslim
(74) *Attorney, Agent, or Firm* — Kevin B. Jackson

(57) ABSTRACT

In one example, an electronic device includes a substrate with a substrate first side; a substrate second side opposite to the substrate first side, a substrate lateral side connecting the substrate first side to the substrate second side, a dielectric structure, and a conductive structure. A substrate dock includes a substrate dock base at the substrate first side and a first substrate dock sidewall extending upward from the substrate dock base. The substrate dock base and the first substrate dock sidewall define a substrate dock cavity. A cover structure includes a cover sidewall with a cover sidewall lower side. An interface material couples the cover sidewall to the substrate dock. An electronic component is coupled to the conductive structure. Other examples and related methods are also disclosed herein.

20 Claims, 16 Drawing Sheets

B-B

(51) Int. Cl.

| | |
|---|---|
| *H10W 42/20* | (2026.01) |
| *H10W 70/68* | (2026.01) |
| *H10W 72/00* | (2026.01) |
| *H10W 72/20* | (2026.01) |
| *H10W 72/30* | (2026.01) |
| *H10W 74/15* | (2026.01) |

(52) U.S. Cl.
CPC .... *H10W 72/07354* (2026.01); *H10W 72/252* (2026.01); *H10W 72/347* (2026.01); *H10W 72/354* (2026.01); *H10W 72/877* (2026.01); *H10W 74/15* (2026.01); *H10W 90/724* (2026.01); *H10W 90/734* (2026.01); *H10W 90/736* (2026.01)

(56) References Cited

U.S. PATENT DOCUMENTS

| | | | |
|---|---|---|---|
| 9,418,909 B1 | 8/2016 | Chaware et al. | |
| 9,608,029 B2 | 3/2017 | Wong | |
| 2010/0013041 A1 | 1/2010 | Bolt | |
| 2020/0402882 A1* | 12/2020 | Kim ..................... | H10W 40/22 |
| 2021/0053148 A1 | 2/2021 | Rieske et al. | |

\* cited by examiner

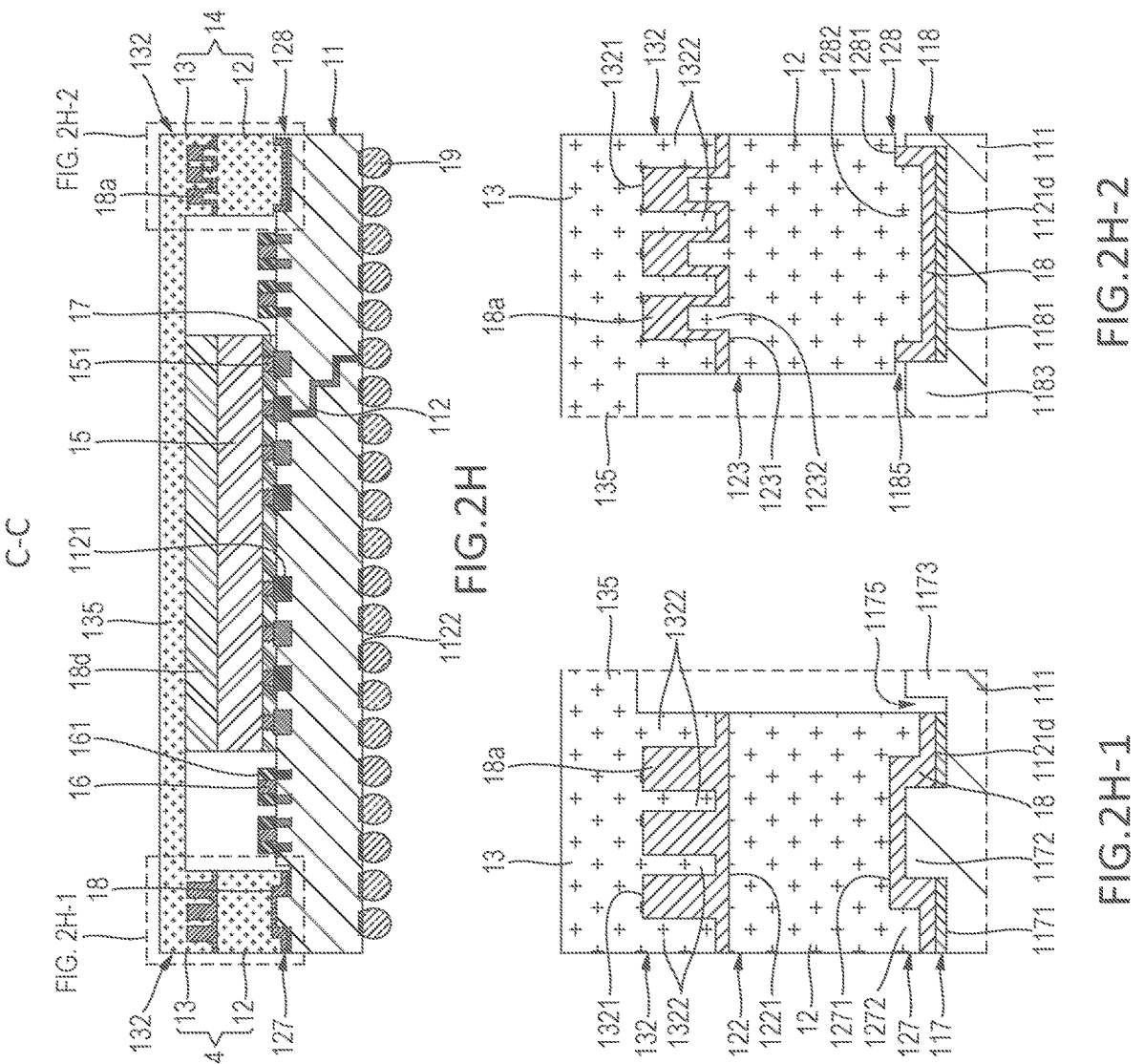

ELECTRONIC DEVICES AND METHODS OF MANUFACTURING ELECTRONIC DEVICES

CROSS-REFERENCE TO RELATED APPLICATIONS

Not applicable.

TECHNICAL FIELD

The present disclosure relates, in general, to electronic devices, more particularly, to semiconductor devices and methods for manufacturing semiconductor devices.

BACKGROUND

Prior semiconductor packages and methods for forming semiconductor packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, 2F, 2G, and 2H show cross-sectional views of an example method for manufacturing an example electronic device.

FIG. 2A-1 shows a cross-sectional view of the portion of the example electronic device in box 2A-1 in FIG. 2A.

FIG. 2A-2 shows a cross-sectional view of the portion of the example electronic device in box 2A-2 in FIG. 2A.

FIG. 2B-1 shows a cross-sectional view of the portion of the example electronic device in box 2B-1 in FIG. 2B.

FIG. 2B-2 shows a cross-sectional view of the portion of the example electronic device in box 2B-2 in FIG. 2B.

FIG. 2E-1 shows a cross-sectional view of the portion of the example electronic device in box 2E-1 in FIG. 2E.

FIG. 2E-2 shows a cross-sectional view of the portion of the example electronic device in box 2E-2 in FIG. 2E.

FIG. 2F-1 shows a cross-sectional view of the portion of the example electronic device in box 2F-1 in FIG. 2F.

FIG. 2F-2 shows a cross-sectional view of the portion of the example electronic device in box 2F-2 in FIG. 2F.

FIG. 2G-1 shows a cross-sectional view of the portion of the example electronic device in box 2G-1 in FIG. 2G.

FIG. 2G-2 shows a cross-sectional view of the portion of the example electronic device in box 2G-2 in FIG. 2G.

FIG. 2H-1 shows a cross-sectional view of the portion of the example electronic device in box 2H-1 in FIG. 2H.

FIG. 2H-2 shows a cross-sectional view of the portion of the example electronic device in box 2H-2 in FIG. 2H.

Figure 1A:
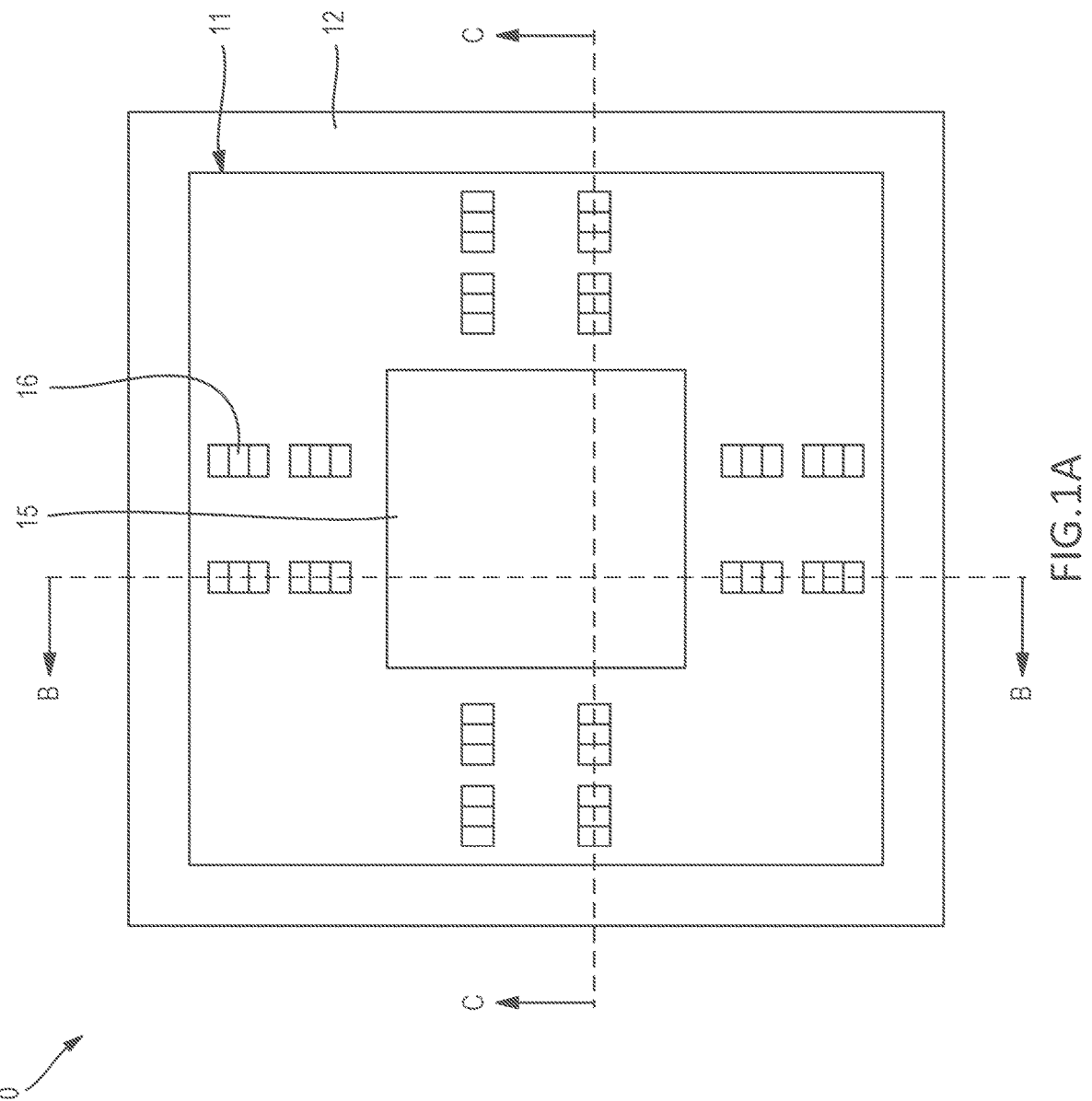
FIG. 1A shows a plan view of an example electronic device.

The following discussion provides various examples of semiconductor devices and methods of manufacturing semiconductor devices. Such examples are non-limiting, the scope of the appended claims should not be limited to the particular examples disclosed. In the following discussion, the terms "example" and "e.g." are non-limiting.

The figures illustrate the general manner of construction, descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," and "including," are "open ended" terms and specify the presence of stated features, but do not preclude the presence or addition of one or more other features.

The terms "first," "second," etc. may be used herein to describe various elements, these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. As used herein, the term "coupled" can refer to an electrical coupling or a mechanical coupling. Similarly, the terms "over" and "on" may be used to describe two elements directly contacting each other or describe two elements indirectly connected by one or more other elements.

DESCRIPTION

In an example, an electronic device includes a substrate with a substrate first side; a substrate second side opposite to the substrate first side, a substrate lateral side connecting the substrate first side to the substrate second side, a dielectric structure, and a conductive structure. A substrate dock includes a substrate dock base at the substrate first side and a first substrate dock sidewall extending upward from the substrate dock base. The substrate dock base and the first substrate dock sidewall define a substrate dock cavity. A cover structure includes a cover sidewall with a cover sidewall lower side. An interface material couples the cover sidewall to the substrate dock. An electronic component is coupled to the conductive structure.

In an example, an electronic device includes a substrate including a substrate first side, a substrate second side opposite to the substrate first side, and a substrate lateral side connecting the substrate first side to the substrate second side. A substrate dock is at the substrate first side proximate to the substrate lateral side. A cover structure includes a cover sidewall comprising a cover sidewall lower side and a lower dock at the cover sidewall lower side. An interface material couples the lower dock to the substrate dock so that the lower dock and the substrate dock overlap in a vertical direction. An electronic component coupled to the substrate first side.

In an example, a method of manufacturing an electronic device includes providing a substrate including a substrate first side, a substrate second side opposite to the substrate first side, a substrate lateral side connecting the substrate first side to the substrate second side, and a substrate dock at the substrate first side proximate to the substrate lateral side. The method includes providing a cover structure including a cover sidewall comprising a cover sidewall lower side and a lower dock at the cover sidewall lower side. The method includes coupling the lower dock and the substrate dock with an interface material so that the lower dock and the substrate dock overlap in a vertical direction. The method includes coupling an electronic component to the substrate first side.

Other examples are included in the present disclosure. Such examples may be found in the figures, in the claims, or in the description of the present disclosure.

Figures 1B, 1C:
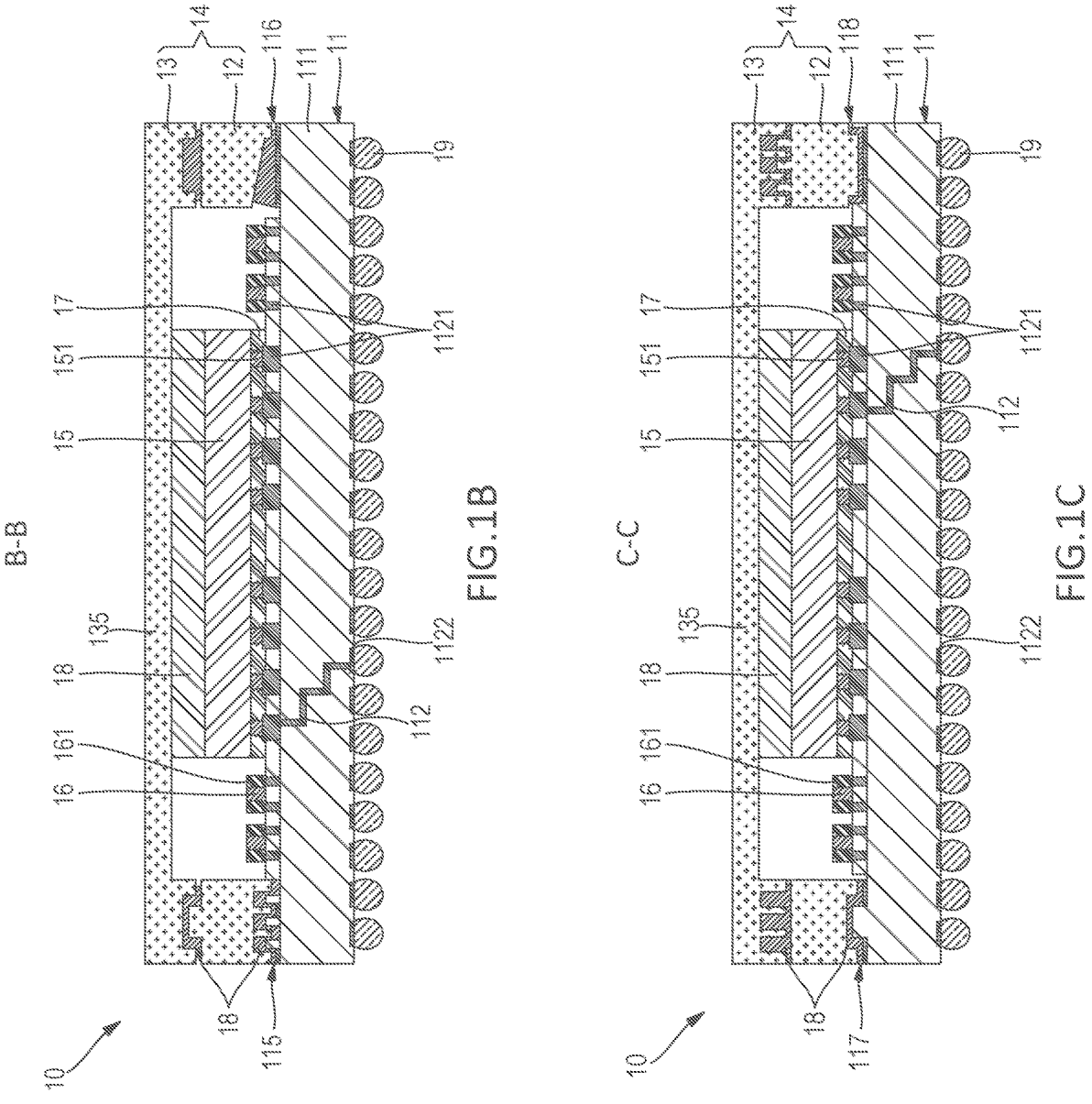
FIGS. 1B and 1C show cross-sectional views of an example electronic device taken along the line B-B and the line C-C, respectively, in FIG. 1A.

FIGS. 1A to 1C show an example electronic device 10. FIG. 1A shows a plan view of electronic device 10. FIG. 1B shows a cross-section view of electronic device 10 taken along line B-B in FIG. 1A. FIG. 1C shows a cross-section view of electronic device 10 taken along line C-C in FIG. 1A. In the example shown in FIGS. 1A to 1C, electronic device 10 can comprise substrate 11, cover structure 14, electronic component 15, electronic components 16, underfill 17, interface material 18, and external interconnects 19.

Substrate 11 can comprise dielectric structure 111, conductive structure 112, and substrate docks 115, 116, 117, 118. Conductive structure 112 can comprise upper terminals 1121 and lower terminals 1122. Cover structure 14 can comprise cover sidewall 12 and cover lid 13. It is noted that cover lid 13 and interface material 18 are removed from the plan view of FIG. 1A to better illustrate electronic components 15 and 16. Electronic component 15 can comprise component terminals 151. Electronic components 16 can comprise component terminals 161.

Substrate 11, cover structure 14, underfill 17, interface material 18, external interconnects 19 can comprise or be referred to as an electronic package or a package. The electronic package can protect electronic components 15 and 16 from external elements or environmental exposure. The electronic package can also provide couplings between electronic component 15 and electronic components 16 and between electronic components 15 and 16 and external components or other electronic packages.

FIGS. 2A to 2H show cross-sectional views of an example method for manufacturing an example electronic device, such as electronic device 10 in FIGS. 1A to 1C.

Figures 1, 2, 2A:
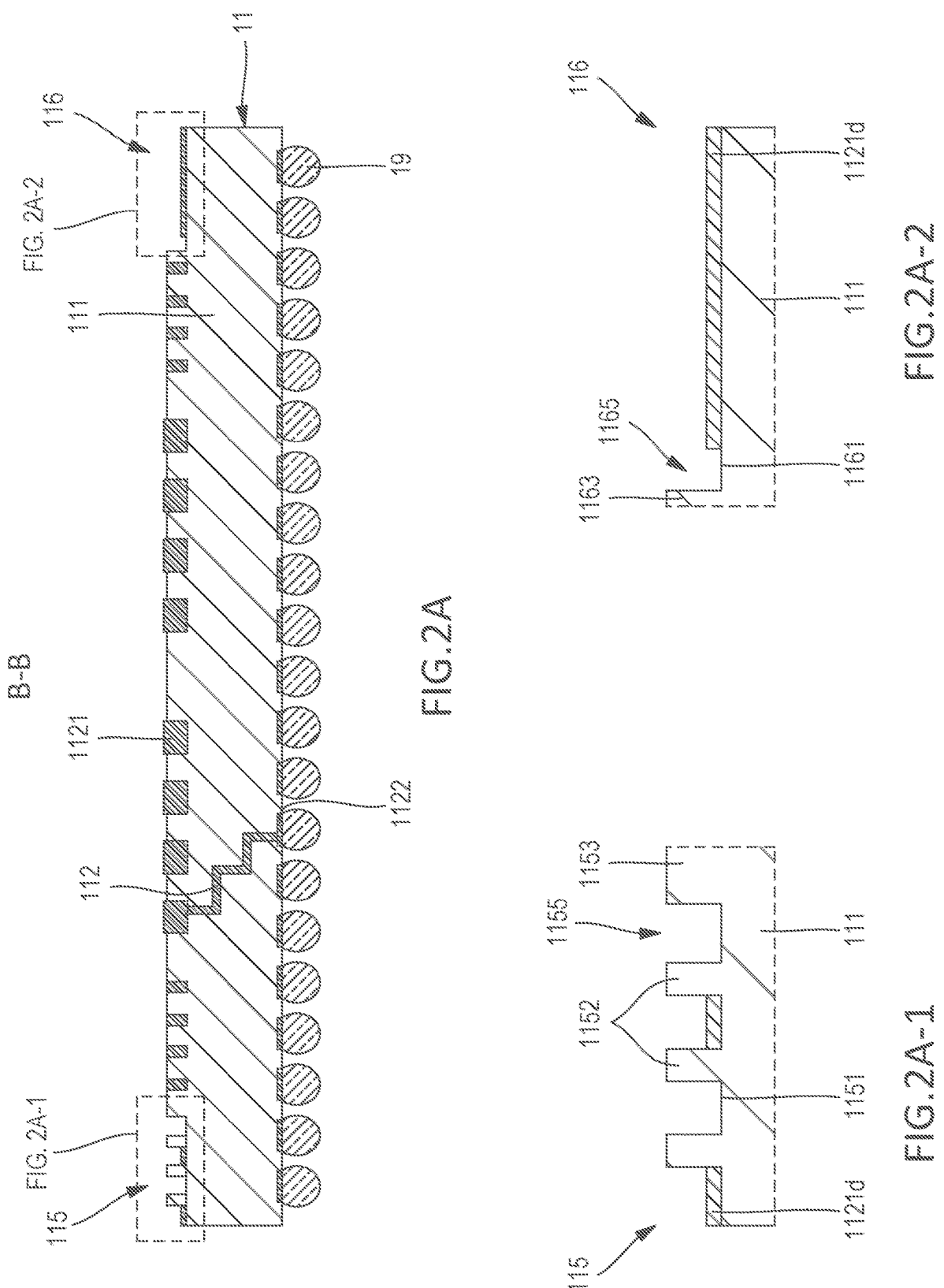
Figures 1, 2, 2B:
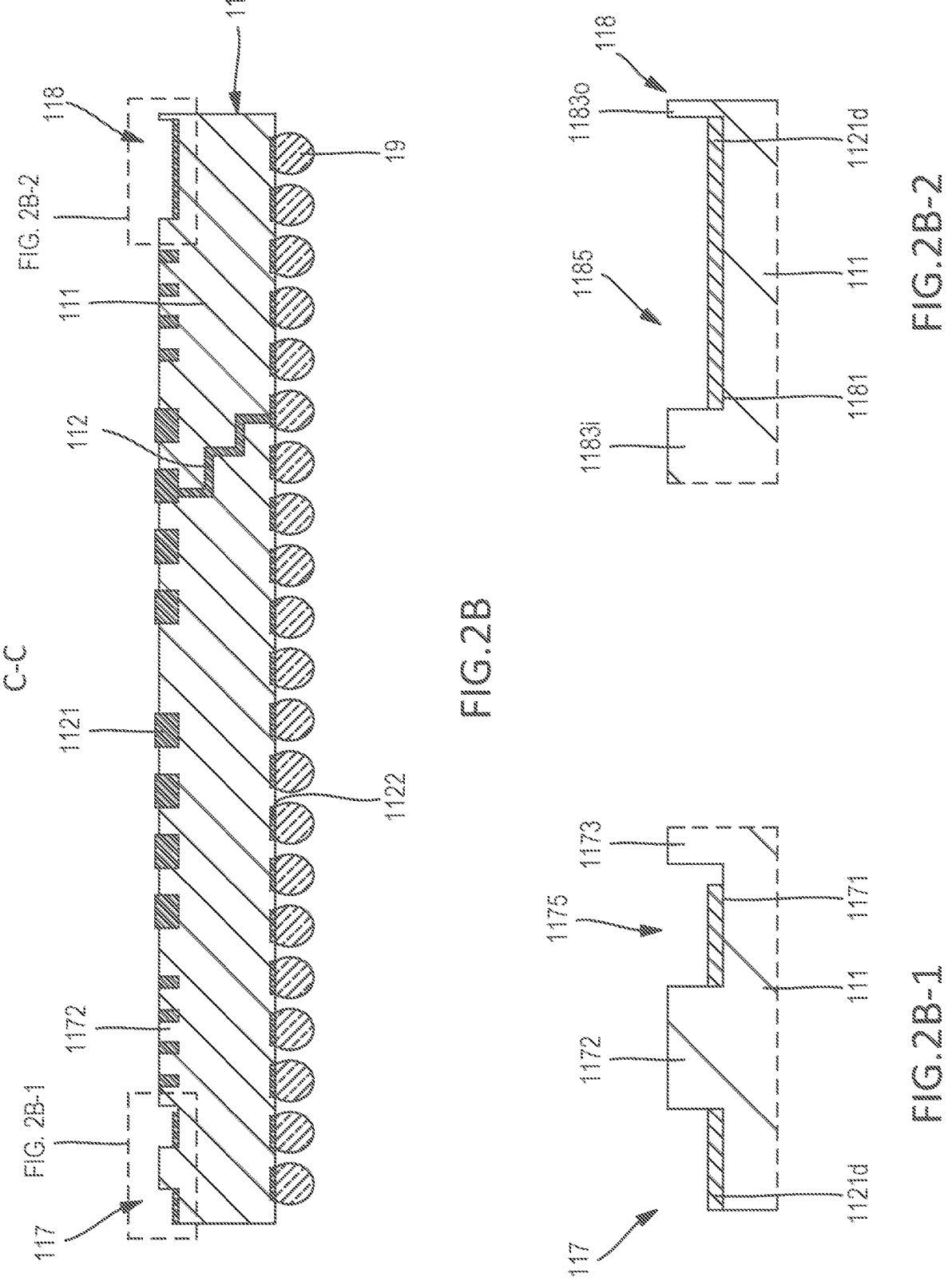

FIGS. 2A and 2B show electronic device 10 at an early stage of manufacture. FIG. 2A shows a cross-sectional view along line B-B in FIG. 1A, and FIG. 2B shows a cross-sectional view along line C-C in FIG. 1A. In the example shown in FIGS. 2A and 2B, substrate 11 can be provided. In some examples, substrate 11 can comprise or be referred to as a printed circuit board (PCB), a laminate substrate, a preformed substrate, or a redistribution layer (RDL) substrate. Substrate 11 can comprise dielectric structure 111, conductive structure 112, and substrate docks 115, 116, 117, 118. In some examples, the vertical thickness of substrate 11 can range from about 50 micrometers ($\mu$m) micrometers to about 5000 $\mu$m.

Dielectric structure 111 can comprise or be referred to as one or more dielectrics, dielectric materials, dielectric layers, passivation layers, insulating layers, or protective layers. In some examples, dielectric structure 111 can comprise a polymer, polyimide (PI), benzocyclobutene (BCB), polybenzoxazole (PBO), bismaleimide triazine (BT), a molding material, a phenolic resin, epoxy, silicone, or an acrylate polymer. Layers or portions of dielectric structure 111 can be interleaved with layers or features of conductive structure 112. Dielectric structure 111 can expose a portion of conductive structure 112. Dielectric structure 111 can provide structural support for substrate 11 and electrical isolation for different portions of conductive structure 112. In some examples, dielectric structure 111 can be provided by spin coating, spray coating, printing, oxidation, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, the vertical thicknesses of individual layers of dielectric structure 111 can range from about 5 $\mu$m to about 1000 $\mu$m. The combined vertical thickness of all layers of dielectric structure 111 can define the vertical thickness of substrate 11.

Conductive structure 112 can comprise or be referred to as one or more conductors, conductive materials, conductive paths, conductive layers, redistribution layers, wiring layers, traces, vias, or pads. In some examples, conductive structure 112 can comprise copper, aluminum, palladium, titanium, tungsten, titanium/tungsten, nickel, gold, or silver. In some examples, conductive structure 112 can be provided by sputtering, electroless plating, electrolytic plating, PVD, CVD, MOCVD, ALD, LPCVD, or PECVD. Conductive structure 112 can transmit signals, currents, or voltages through substrate 11. In some examples, the vertical thicknesses of conductive structure 112 can range from about 1 $\mu$m to about 30 $\mu$m. The vertical thickness of conductive structure 112 can refer to individual layers of conductive structure 112. Conductive structure 112 can comprise upper terminals 1121 located at an upper (or first) side of substrate 11 and lower terminals 1122 located at a lower (or second) side of substrate 11.

In accordance with various examples, upper terminals 1121 can comprise or be referred to as traces, pads, underbump metallizations (UBMs), lands, circuit patterns, or metal layers. Upper terminals 1121 can be provided on the upper side of substrate 11 and can be exposed from dielectric structure 111 at the upper side of substrate 11. In some examples, upper terminals 1121 can be coupled to lower terminals 1122 through one or more layers of conductive structure 112. In some examples, upper terminals 1121 can comprise copper, aluminum, palladium, titanium, tungsten, titanium/tungsten, nickel, gold, or silver. Upper terminals 1121 can be provided by sputtering, electroless plating, electrolytic plating. PVD, CVD, MOCVD, ALD, LPCVD, or PECVD. In some examples, the vertical thicknesses of upper terminals 1121 can range from about 1 $\mu$m to about 30 $\mu$m.

In accordance with various examples, lower terminals 1122 can comprise or be referred to as traces, pads, UBMs, lands, circuit patterns, or metal layers. Lower terminals 1122 can be provided on the lower side of substrate 11 and can be exposed from dielectric structure 111 at the lower side of substrate 11. Lower terminals 1122 provide electrical connection between substrate 11 and external interconnects 19. In some examples, lower terminals 1122 can be coupled to upper terminals 1121 through one or more layers of conductive structure 112. In some examples, lower terminals 1122 can comprise copper, aluminum, palladium, titanium, tungsten, titanium/tungsten, nickel, gold, or silver. Lower terminals 1122 can be provided by sputtering, electroless plating, electrolytic plating, PVD, CVD, MOCVD, ALD, LPCVD, or PECVD. In some examples, the vertical thicknesses of lower terminals 1122 can range from about 1 μm to about 30 μm.

With combined reference to FIGS. 2A, 2A-1, 2A-2, 2B, 2B-1, and 2B-1, in some examples, upper terminals 1121 can comprise dock conductors 1121*d* located in substrate docks 115, 116, 117, 118. For example, dock conductors 1121*d* can be provided on dock bases 1151, 1161, 1171, 1181 of substrate docks 115, 116, 117, 118. Dock bases 1151, 1161, 1171, 1181 can comprise (e.g., be provided by, be formed by, or be defined by) a surface of dielectric structure 111. In some examples, dock conductors 1121*d* can be provided in dock cavities 1155, 1165, 1175, 1185 of substrate docks 115, 116, 117, 118. For example, dock bases 1151, 1161, 1171, 1181 can be recessed with regard to the upper side or upper surface of dielectric structure 111. In some examples, the vertical thicknesses of dock conductors 1121*d* can range from about 1 μm to about 30 μm. In some examples, the vertical thicknesses of dock conductors 1121*d* can be smaller than the vertical thickness of the upper terminals 1121 located outside substrate docks 115, 116, 117, 118.

Substrate docks 115, 116, 117, 118 can be provided at the edge or perimeter of the upper side of substrate 11. In some examples, substrate docks 115, 116, 117, 118 can be arranged consecutively along the top perimeter of the substrate 11. Substrate docks 115, 116, 117, 118 can be provided coupled to one another and provided continuously along the edge of substrate 11, or substrate docks 115, 116, 117, 118 can be spaced apart from each other and provided discontinuously along the edge of substrate 11.

In the example shown in FIG. 2A-1, substrate dock 115 can comprise dock base 1151, dock protrusions 1152, dock sidewall 1153, and dock cavity 1155. Dock base 1151 can be lower than (i.e., recessed with respect to) the top/upper surface of substrate 11. Dock base 1151 can support dock protrusions 1152. Dock protrusions 1152 and dock sidewall 1153 can extend from dock base 1151. In some examples, dock conductors 1121*d* can be provided on dock base 1151.

One or more dock protrusions 1152 can be provided on dock base 1151. Dock protrusions 1152 can be spaced apart from each other. Dock protrusions 1152 can protrude upwardly from dock base 1151. In some examples, dock protrusions 1152 can be defined by one or more layers of dielectric structure 111. In some examples, dock protrusions 1152 can be provided by forming one or more dielectric layers on dock base 1151 and etching or removing portions of such dielectric layers, thereby leaving dock protrusions 1152. In some examples, the vertical thicknesses of dock protrusions 1152 can range from about 1 μm to about 30 μm, and the pitch of dock protrusions 1152 can range from about 10 μm to about 500 μm. In some examples, the vertical thicknesses of dock protrusions 1152 can be greater than those of dock conductors 1121*d*.

In some examples, dock sidewall 1153 can be defined by one or more layers of dielectric structure 111. In some examples, dock sidewall 1153 can be provided at an inward side of substrate dock 115 (i.e., at a side of substrate dock 115 that is distal to, or spaced apart from, the lateral side of substrate 11). In some examples and with momentary reference to FIG. 2E, dock sidewall 1153 can restrict interface material 18 from flowing inward over the upper side of substrate 11 and towards electronic components 15 and 16. In some examples, dock protrusions 1152 or dock sidewall 1153 can be defined by a solder mask provided as part of, over, or on substrate 11.

In some examples, dock cavity 1155 can comprise or be referred to as a trench, a channel, or a groove. In some examples, dock cavity 1155 can be defined by dock base 1151 and dock sidewall 1153. Dock protrusions 1152 and dock conductors 1121*d* can be provided within dock cavity 1155. In some examples, one or more dock conductor(s) 1121*d* can extend to the lateral side of substrate 11 and/or one or more dock conductor(s) 1121*d* can be located between dock protrusions 1152. In some examples, one or more dock conductor(s) 1121*d* can be located between dock protrusion 1152 and dock sidewall 1153. In some examples, dock cavity 1155 can provide a space for interface material 18 (FIG. 2E) to reside. In some examples, the width of dock cavity 1155, as measured between the lateral side of substate 11 and dock sidewall 1153, can range from about 10 μm to about 10000 μm.

In the example shown in FIG. 2A-2, substrate dock 116 can comprise dock base 1161, dock sidewall 1163, and dock cavity 1165. Dock base 1161 can be lower than (i.e., recessed with respect to) the top/upper surface of substrate 11. Dock sidewall 1163 can extend from dock base 1161. In some examples, dock conductor(s) 1121*d* can be provided on dock base 1161.

In some examples, dock sidewall 1163 can be defined by one or more layers of dielectric structure 111. In some examples, dock sidewall 1163 can be provided at an inward side of substrate dock 116 (i.e., dock sidewall 1163 can be distal to, or spaced apart from, the lateral side of substrate 11). In some examples and with momentary reference to FIG. 2E, dock sidewall 1163 can restrict interface material 18 from flowing inward over the upper side of substrate 11 towards electronic components 15 and 16. In some examples, dock sidewall 1163 can be defined by a solder mask provided as part of, over, or on substrate 11.

In some examples, dock cavity 1165 can comprise or be referred to as a trench, a channel, or a groove. In some examples, dock cavity 1165 can be defined by dock base 1161 and dock sidewall 1163. Dock conductor(s) 1121*d* can be provided within dock cavity 1165. In some examples, one or more dock conductor(s) 1121*d* can extend to the lateral side of substrate 11. In some examples, dock cavity 1165 can provide a space for interface material 18 (FIG. 2E) to reside. In some examples, the width of dock cavity 1165, as measured between the lateral side of substate 11 and dock sidewall 1163, can range from about 10 μm to about 10000 μm.

In the example shown in FIG. 2B-1, substrate dock 117 can comprise dock base 1171, dock protrusion 1172, dock sidewall 1173, and dock cavity 1175. Dock base 1171 can be lower than (i.e., recessed with respect to) the top/upper side or surface of substrate 11. Dock protrusion 1172 and sidewall 1173 can extend from dock base 1171. In some examples, dock conductor(s) 1121*d* can be provided on dock base 1171.

Dock protrusion 1172 can protrude upwardly from dock base 1171. In some examples, dock protrusion 1172 can be defined by one or more layers of dielectric structure 111. In some examples, dock protrusion 1172 can be provided by forming one or more dielectric layers on dock base 1171 and etching or removing portions of the dielectric layers, thereby leaving dock protrusion 1172. In some examples, the vertical thicknesses of dock protrusion 1172 can range from about 1 μm to about 30 μm. The width of dock protrusion 1172 can range from about 10 μm to about 500 μm. In some examples, the vertical thicknesses of dock protrusion 1172 can be greater than the vertical thickness of dock conductor(s) 1121*d*.

In some examples, dock sidewall 1173 can be defined by one or more layers of dielectric structure 111. In some examples, dock sidewall 1173 can be provided at an inward side of substrate dock 117 (i.e., dock sidewall 1173 can be distal to, or spaced apart from, the lateral side of substate 11. In some examples and with momentary reference to FIG. 2F, dock sidewall 1173 can restrict interface material 18 from flowing over the upper side of substrate 11 and towards electronic components 15 and 16. In some examples, dock protrusion 1172 or dock sidewall 1173 can be defined by a solder mask provided as part of, over, or on substrate 11.

In some examples, dock cavity 1175 can comprise or be referred to as a trench, a channel, or a groove. In some examples, dock cavity 1175 can be defined by dock base 1171 and dock sidewall 1173. Dock protrusion 1172 and dock conductors 1121*d* can be provided within dock cavity 1175. In some examples, one or more dock conductor(s) 1121*d* can extend to the lateral side of substrate 11. In some examples, one or more dock conductor(s) 1121*d* can be located between dock protrusion 1172 and the lateral side of substrate 11 and/or between dock protrusion 1172 and dock sidewall 1173. In some examples, dock cavity 1175 can provide a space for interface material 18 (FIG. 2F) to reside. In some examples, the width of dock cavity 1175, as measured between the lateral side of substate 11 and dock sidewall 1173, can range from about 10 μm to about 10000 μm.

In the example shown in FIG. 2B-2, substrate dock 118 can comprise dock base 1181, dock inner sidewall 1183*i*, dock outer sidewall 1183*o*, and dock cavity 1185. Dock base 1181 can be lower than (i.e., recessed with respect to) the top surface or upper side of substrate 11. In some examples, dock conductor(s) 1121*d* can be provided on dock base 1181.

In accordance with various examples, dock inner sidewall 1183*i* and dock outer sidewall 1183*o* can extend upward from dock base 1181. In some examples, dock inner sidewall 1183*i* and dock outer sidewall 1183*o* can be defined by one or more layers of dielectric structure 111. Dock inner sidewall 1183*i* can be provided at an inward side of substrate dock 118 and dock outer sidewall 1183*o* can be proved at an outer side of substrate dock 118. For example, dock inner sidewall 1183*i* can be provided at a side of substrate dock 118 that is distal to, or spaced apart from, the lateral side of substrate 11, and dock outer sidewall 1183*o* can be provided at a side of substrate dock 118 that is proximate, or adjacent, to the lateral side of substrate 11. In some examples and with momentary reference to FIG. 2F, dock inner sidewall 1183*i* can restrict interface material 18 from flowing over the upper side of substrate 11 and towards electronic components 15 and 16. Dock outer sidewall 1183 can restrict interface material 18 from flowing outward over the lateral side of substrate 11. In some examples, dock inner sidewall 1183*i* or dock outer sidewall 1183*o* can be defined by a solder mask provided as part of, over, or on substrate 11.

In some examples, dock cavity 1185 can comprise or be referred to as a trench, a channel, or a groove. In some examples, dock cavity 1185 can be defined by dock base 1181, dock inner sidewall 1183*i*, and dock outer sidewall 1183*o*. Dock conductor(s) 1121*d* can be provided within dock cavity 1185 and/or between dock inner sidewall 1183*i* and dock outer sidewall 1183*o*. In some examples, dock cavity 1185 can provide a space for interface material 18 (FIG. 2F) to reside. In some examples, the width of dock cavity 1185, as measured between dock inner sidewall 1183*i* and dock outer sidewall 1183*o*, can range from about 10 μm to about 10000 μm.

Returning to FIG. 2B, external interconnects 19 can be provided on the lower side of substrate 11. In some examples, external interconnects 19 can be coupled to lower terminals 1122 of conductive structure 112. In some examples, external interconnects 19 can comprise or be referred to as solder balls, solder-coated-metal core balls (e.g., solder coated copper core balls), bumps, pillars, or pillars with solder caps. External interconnects 19 can comprise tin (Sn), silver (Ag), lead (Pb), copper (Cu), Sn—Pb, Sn37-Pb, Sn95-Pb, Sn—Pb—Ag. Sn—Cu, Sn—Ag, Sn—Au, Sn—Bi, or Sn—Ag—Cu. In some examples, external interconnects 19 can be provided through a reflow process after forming a conductive material containing solder on the lower side of substrate 11 by using a ball drop method. In some examples, external interconnects 19 also can be provided in the final stage of manufacture. External interconnects 19 can couple electronic device 10 to an external device. In some examples, the vertical thicknesses of external interconnects 19 can range from about 10 μm to about 1000 μm.

In some examples, substrate 11 can be a RDL substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device,/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride (Si3N4), silicon oxide (SiO2),/or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. In accordance with various examples, substrates, as disclosed herein, can comprise RDL substrates.

In some examples, substrate 11 can be a pre-formed substrate. Pre-formed substrates can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves,/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, dielectric and conductive layers can be formed on the permanent core structure. In other examples, the pre-formed substrate can be a coreless substrate which omits the permanent core structure, the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. In accordance with various examples, substrates, as disclosed herein, can comprise pre-formed substrates.

Figures 2C, 2D:
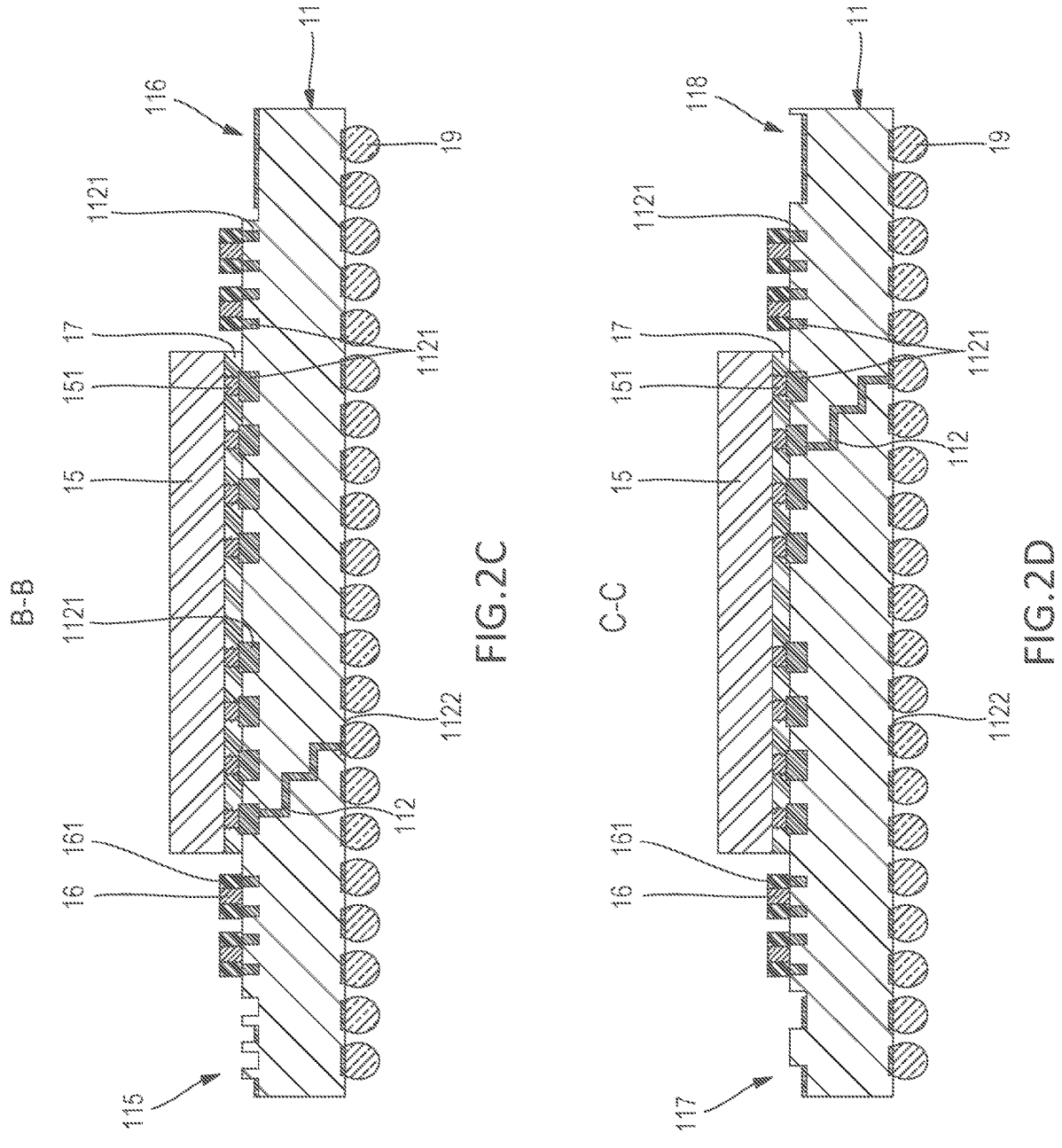

FIGS. 2C and 2D show cross-sectional views of electronic device 10 at a later stage of manufacture. FIG. 2C shows a cross-sectional view of electronic device 10 along line B-B in FIG. 1A. FIG. 2D shows a cross-sectional view of electronic device 10 along line C-C in FIG. 1A. In accordance with various examples, electronic components 15 and 16 are provided over substrate 11. Electronic components 15 and 16 can be coupled to conductive structure 112 of substrate 11. Electronic components 15 and 16 can be coupled to conductive structure 112 by, for example, a mass reflow process, a thermal compression process, or a laser bonding process. Conductive structure 112 can couple electronic component 15 to electronic components 16 and can couple electronic components 15 and 16 to external interconnects 19.

Electronic component 15 can comprise or be referred to as one or more dies, chips, or packages. In some examples, electronic component 15 can comprise a memory, a digital signal processor (DSP), a microprocessor, a network processor, a power management processor, an audio processor, an RF circuit, a wireless baseband system-on-chip (SoC) processor, a sensor, an electrical circuit, such as application specific integrated circuit. In some examples, more than one electronic component 15 of same or different types can be coupled to the upper side of substrate 11. In some examples, the height of electronic component 15 can range from about 10 μm to about 1000 μm. Electronic component 15 can comprise component terminals 151.

In some examples, component terminals 151 can comprise or be referred to as bumps, solder balls, pillars, pillar with solder caps, or pads. Component terminals 151 can provide an electrical connection or contact between electronic component 15 and conductive structure 112. Component terminals 151 can be coupled to upper terminals 1121 of substrate 11. In some examples, component terminals 151 can comprise copper, aluminum, palladium, titanium, tungsten, titanium/tungsten, nickel, gold, or silver. In some examples, the vertical thicknesses of component terminals 151 can range from about 1 μm to about 200 μm.

In some examples, one or more of electronic components 16 comprise or be referred to as a passive device or a passive component. For example, electronic component 16 can comprise a capacitor, an inductor, or a resistor. In some examples, one or more of electronic components 16 can comprise an active device or active component (e.g., a semiconductor die or package). In some examples, the height of electronic component 16 can range from about 10 μm to about 500 μm. Electronic component 16 can comprise component terminals 161.

In some examples, component terminals 161 can be provided at opposite lateral sides of electronic component 16. Component terminals 161 provide electrical connection or contact between electronic component 16 and conductive structure 112. Component terminals 161 can be coupled to upper terminals 1121.

In some examples, underfill 17 can be provided between electronic component 15 and substrate 11. In some examples, underfill 17 can comprise or be referred to as Capillary Underfill (CUF), Molded Underfill (MUF), Non-Conductive Paste (NCP), Non-Conductive Film (NCF), or Anisotropic Conductive Film (ACF). In some examples, underfill 17 can comprise epoxy, a thermoplastic material, a thermoset material, polyimide, polyurethane, a polymeric material, filled epoxy, a filled thermoplastic material, a filled thermoset material, filled polyimide, filled polyurethane, a filled polymeric material, or fluxing underfill. Underfill 17 can cover or surround component terminals 151. Underfill 17 can extend between or contact the upper side of substrate 11 and the bottom side of electronic component 15. In some examples, underfill 17 can cover, at least, a portion of the lateral sides of electronic component 15. In some examples, underfill 17 can reduce or prevent occurrences of electronic component 15 separating from substrate 11. In some examples, the vertical thickness of underfill 17 can range from about 1 μm to about 200 μm.

Figures 1, 2, 2E:
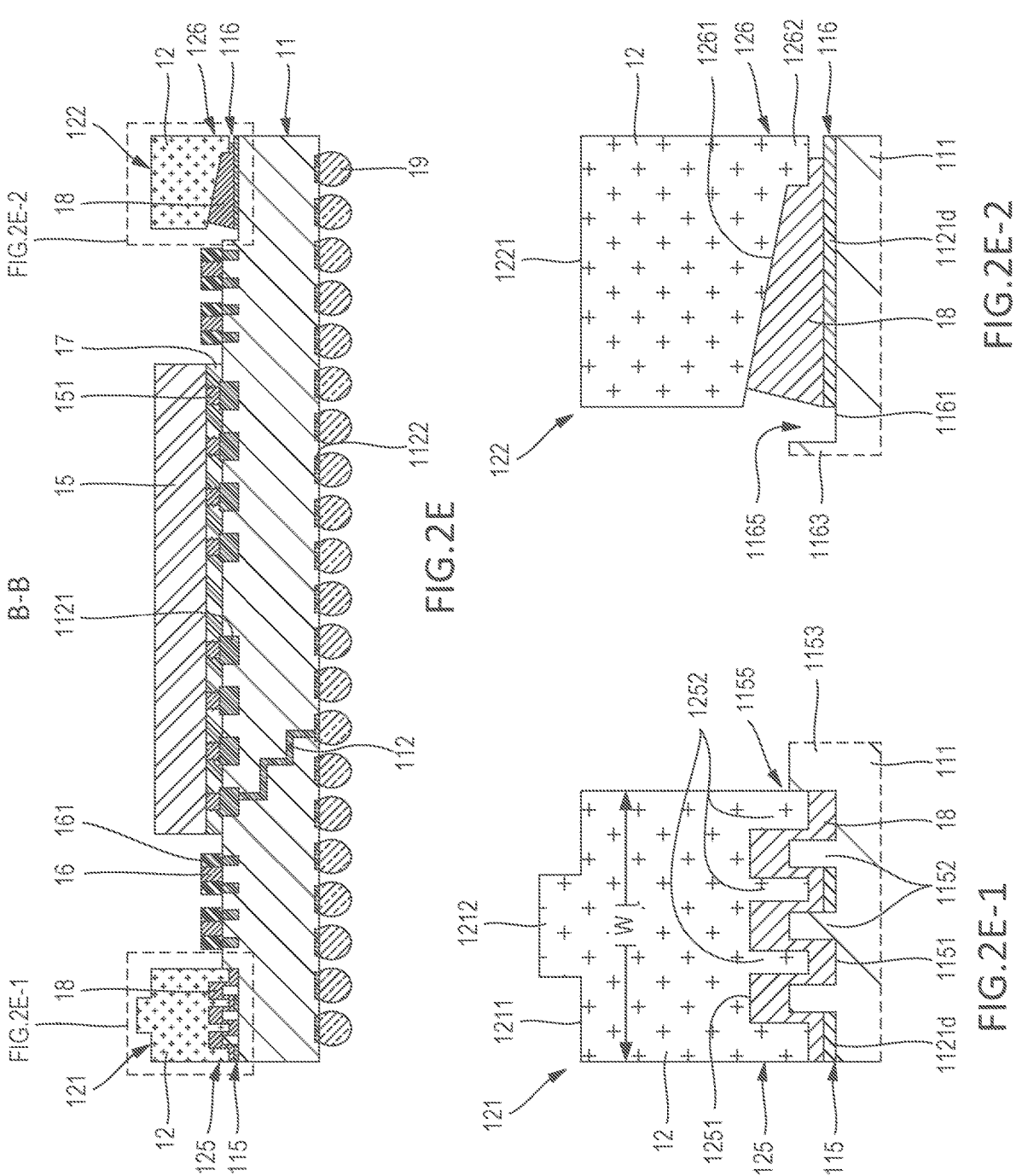
Figures 1, 2, 2F:
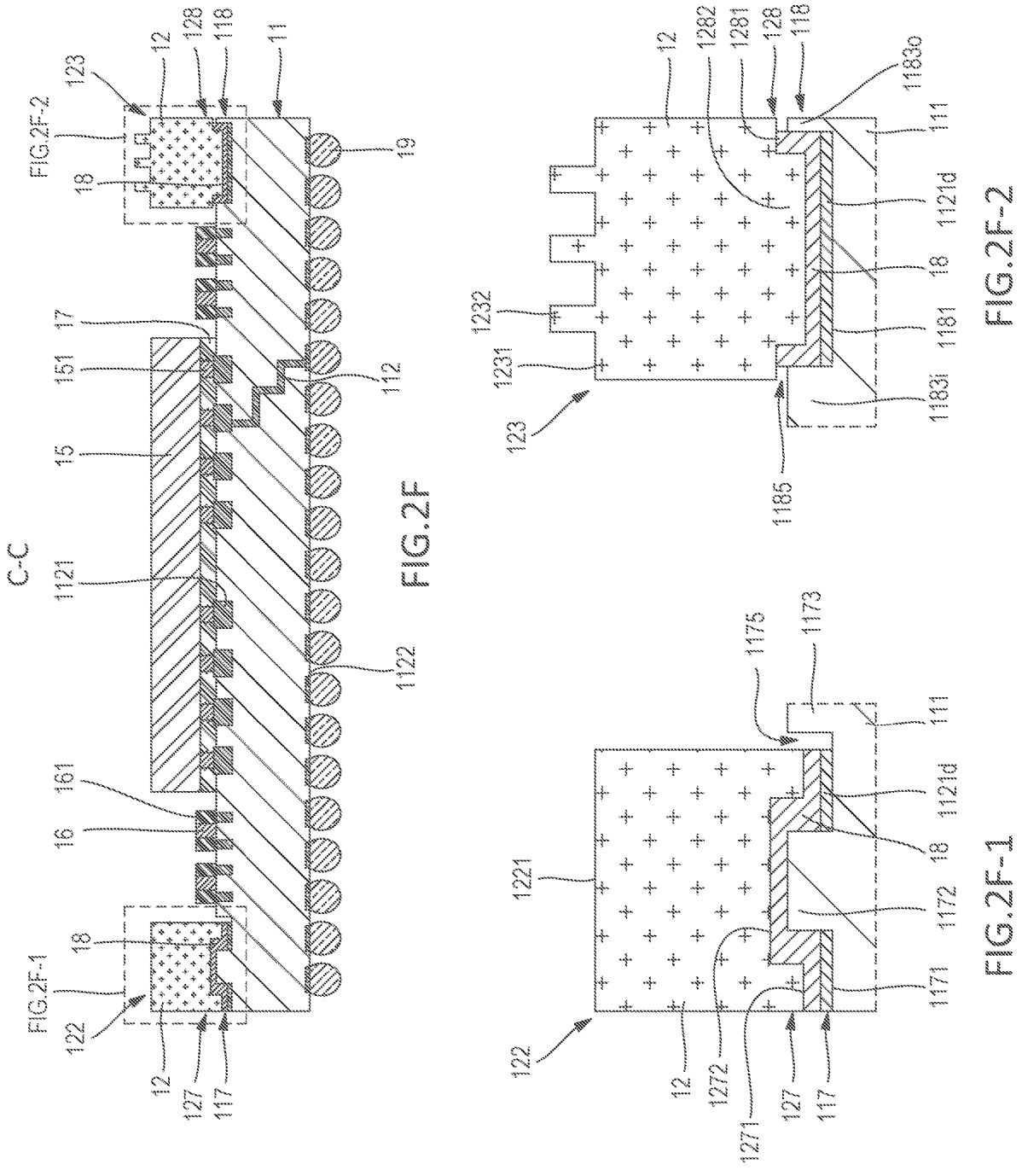

FIGS. 2E and 2F show cross-sectional views of electronic device 10 at a later stage of manufacture. FIG. 2E shows a cross-sectional view of electronic device 10 along line B-B in FIG. 1A. FIG. 2F shows a cross-sectional view of electronic device 10 along line C-C in FIG. 1A. FIG. 2E-1 shows the portion of electronic device 10 located in box 2E-1 in FIG. 2E. FIG. 2E-2 shows the portion of electronic device 10 located in box 2E-2 in FIG. 2E. FIG. 2F-1 shows the portion of electronic device 10 located in box 2F-1 in FIG. 2F. FIG. 2F-2 shows the portion of electronic device 10 located in box 2F-2 in FIG. 2F.

In accordance with various examples, cover sidewall 12 can be provided over substrate 11. Cover sidewall 12 can be provided at the perimeter or outer edge of the upper side of substrate 11. In some examples, cover sidewall 12 can be provided on substrate docks 115, 116, 117, 118. In some examples, cover sidewall 12 can be adhered or coupled to substrate 11 through interface material 18. In some examples, interface material 18 can be provided on substrate docks 115, 116, 117, 118, and cover sidewall 12 can then be seated on interface material 18. In some examples, interface material 18 can then be curing or sintering cured or sintered to finish adhering or coupling cover sidewall 12 to substrate 11. In some examples, interface material 18 can be provided on the bottom side of cover sidewall 12 and then cover sidewall 12, including interface material 18, can be seated on substrate docks 115, 116, 117, 118. The features or shape of substrate docks 115, 116, 117, 118 can increase the area of contact with interface material 18. Increasing contact area with interface material 18 tends to improve adhesion between substrate 11 and cover structure 14. Substrate docks 115, 116, 117, 118 can also restrict the flow of interface material 18 over the upper side substrate 11.

In accordance with various examples, cover sidewall 12 can comprise or be referred to as a stiffener. In some examples, cover sidewall 12 can comprise a metallic material such as copper, nickel, or stainless steel. In some examples, the width W (FIG. 2E-1) of cover sidewall 12, as measured between the outward facing side of cover sidewall 12 and the inward facing side of cover sidewall 12, can range from about 10 μm to about 10000 μm. The height of cover sidewall 12 can range from about 100 μm to about 2000 μm. Cover sidewall 12 can comprise upper docks 121, 122, 123 and lower docks 125, 126, 127, 128. Upper docks 121, 122, 123 can be provided on the top or upper side of cover sidewall 12 (i.e., on the side oriented away from substate 11). Lower docks 125, 126, 127, 128 can be provided on the bottom or lower side of cover sidewall 12 (i.e., the side oriented toward substate 11). In some examples, upper docks 121, 122, 123 can be coupled to one another along the upper side of cover sidewall 12 (e.g., upper docks 121, 122, 123 can be continuous with one another along the upper side of cover sidewall 12). In some examples, upper docks 121, 122, 123 can be spaced apart, or discontinuous, from one another along the upper side of cover sidewall 12. In some examples, lower docks 125, 126, 127, 128 can be coupled to, or continuous with, one another along the lower side of cover sidewall 12. In some examples, lower docks 125, 126, 127, 128 can be spaced apart, or discontinuous, from one another along the lower side of cover sidewall 12. Lower docks 125, 126, 127, 128 can increase an area of contact with interface material 18 and can improve adhesion between substrate 11 and cover sidewall 12. With momentary reference to FIG. 2G, upper docks 121, 122, 123 can increase an area of contact with upper interface material 18a and can improve adhesion between cover sidewall 12 and cover lid 13.

With reference to FIG. 2E-1, upper dock 121 can comprise dock base 1211 and dock protrusion 1212. In some examples, dock base 1211 can comprise or be referred to as the top or upper portion of cover sidewall 12. Dock protrusion 1212 can protrude from dock base 1211. In some examples, dock protrusion 1212 can be provided in a central portion of dock base 1211 (e.g., dock protrusion 1212 can be spaced apart from the inner lateral side and the outer lateral side of cover sidewall 12). Dock protrusion 1212 can be provided by, for example, punching, etching, milling, or laser ablating cover sidewall 12. In some examples, the vertical thickness of dock protrusion 1212 can range from about 1 μm to about 100 μm and the width of dock protrusion 1212 can range from about 10 μm to about 5000 μm.

With reference to FIG. 2E-2, upper dock 122 can comprise dock base 1221. In some examples, dock base 1221 can comprise or be referred to as the top or upper portion of cover sidewall 12. In some examples, dock base 1221 can comprise a substantially flat surface extending from the inner lateral side to the outer lateral side of cover sidewall 12. Dock base 1221 can be substantially parallel to dock base 1161 or to the upper side of dielectric structure 111 or to the upper side of substate 11. In some examples, dock base 1221 can comprise a serrated or roughened surface.

With reference to FIG. 2F-2, upper dock 123 can comprise dock base 1231 and dock protrusions 1232. In some examples, dock base 1231 can comprise or be referred to as the top portion of cover sidewall 12. Dock protrusions 1232 can upwardly protrude from dock base 1231. One or more dock protrusion(s) 1232 can be provided on dock base 1231. Dock protrusions 1232 can be spaced apart from one another. In some examples, dock protrusions 1232 can be provided by removing a portion of cover sidewall 12 by punching, etching, milling, or laser. In some examples, the vertical thicknesses of dock protrusions 1232 can range from about 1 μm to about 100 μm. The pitch of dock protrusions 1232 can range from about 10 μm to about 500 μm.

Returning to FIG. 2E-1, in accordance with various examples, lower dock 125 can comprise dock base 1251 and dock protrusions 1252. Lower dock 125 can be oriented toward and coupled to substrate dock 115. In some examples, dock base 1251 can comprise or be referred to as the bottom or lower portion of cover sidewall 12. One or more dock protrusion(s) 1252 can be provided on dock base 1251. Dock protrusions 1252 can protrude downwardly from dock base 1251. Dock protrusions 1252 can be spaced apart from one another. In some examples, dock protrusion 1252 can be provided by removing a portion of cover sidewall 12 by punching, etching, milling, or laser.

Dock protrusions 1252 can be located between or interleaved with dock protrusions 1152 of substrate dock 115. Dock protrusions 1252 can be located outward of dock sidewall 1153 (i.e., between dock sidewall 1153 and the lateral side of substrate 11). In some examples, portions of dock protrusions 1252 can be received within dock cavity 1155. Interface material 18 can be provided between dock protrusions 1252 and dock base 1151 of substrate dock 115 and/or between dock base 1251 and dock protrusions 1152 of substrate dock 115. In some examples, dock protrusions 1252 located at the inner lateral edge of dock base 1251 can restrict interface material 18 from flowing inward over the upper side of substrate 11. Dock protrusions 1252 located at the outer lateral edge of dock base 1251 can restrict interface material 18 from flowing outward over the lateral side of substrate 11. In some examples, the vertical thicknesses of dock protrusions 1252 can range from about 1 μm to about 100 μm, the pitch of dock protrusions 1252 can range from about 10 μm to about 500 μm.

With reference to FIG. 2E-2, lower dock 126 can comprise dock base 1261 and dock protrusion 1262. In accordance with various examples, lower dock 126 can be coupled to substrate dock 116. In some examples, dock base 1261 can comprise or be referred to as the bottom or lower portion of cover sidewall 12. Dock base 1261 can be inclined or slanted such that a vertical thickness of cover sidewall increases between the inner lateral side of cover sidewall 12 and the outer lateral side of cover sidewall 12. Dock protrusion 1262 can downwardly protrude from dock base 1261. In some examples, dock protrusion 1262 can be provided at an outer perimeter or outer edge of dock base 1261. In some examples, a portion of dock protrusion 1262 can be received within dock cavity 1165. Interface material 18 can be provided between dock base 1261 and dock base 1161 of substrate dock 116. In some examples, dock protrusion 1262 can restrict interface material 18 from flowing outward over the lateral side of electronic device 10. In some examples, dock protrusion 1262 can be provided by removing a portion of cover sidewall 12 by punching, etching, milling, or laser. In some examples, the vertical thickness of dock protrusion 1262 can range from about 1 μm to about 100 μm. The width of dock protrusion 1262 can range from about 10 μm to about 1000 μm.

With reference to FIG. 2F-1, lower dock 127 can comprise dock base 1271 and dock cavity 1272. In some examples, lower dock 127 can be coupled to substrate dock 117. In some examples, dock base 1271 can comprise or be referred to as the bottom or lower portion of cover sidewall 12. Dock cavity 1272 can be formed in (e.g., extend upwardly from) dock base 1271 and can receive dock protrusion 1172. Interface material 18 can be provided between dock bases 1271 and 1171 and between dock cavity 1272 and dock protrusion 1172. In some examples, the sidewalls defining dock cavity 1272 can restrict interface material 18 from flowing inward over the upper side of substrate 11 and outward over the lateral side of electronic device 10. In some examples, dock cavity 1272 can be provided by removing a portion of cover sidewall 12 by punching, etching, milling, or laser. In some examples, the vertical thickness (or depth) of dock cavity 1272 can range from about 1 μm to about 100 μm. The width of dock cavity 1272 can range from about 10 μm to about 5000 μm.

In the example shown in FIG. 2F-2, lower dock 128 can comprise dock base 1281 and dock protrusion 1282. In some examples, lower dock 128 can be coupled to substrate dock 118. In some examples, dock base 1281 can comprise or be referred to as the bottom or lower portion of cover sidewall 12. Dock protrusion 1282 can downwardly protrude from dock base 1281. Dock protrusion 1282 can be provided in the central portion of dock base 1281. For example, a first portion of dock base 1281 may extend between the inner lateral side of cover sidewall 12 and dock protrusion 1282, and a second portion of dock base 1281 may extend between the outer lateral side of cover sidewall 12 and dock protrusion 1282. In some examples, a portion of dock protrusion 1282 can be received within dock cavity 1185. In some examples, dock protrusion 1282 can be located between dock inner sidewall 1183i and dock outer sidewall 1183o. Interface material 18 can be provided between dock protrusion 1282 and dock base 1181 of substrate dock 118. In some examples, dock protrusion 1282 can be provided by removing a portion of cover sidewall 12 by punching, etching, milling, or laser. In some examples, the vertical thickness of dock protrusion 1282 can range from about 1 μm to about 100 μm. The width of dock protrusion 1282 can range from about 10 μm to about 5000 μm.

In accordance with various examples, interface material 18 can comprise or be referred to as an adhesive or a thermal interface material (TIM). For example, interface material 18 can comprise a thermally curable adhesive, a photo-curable adhesive, or a non-curable adhesive (e.g., a polymer adhesive, an acryl adhesive, a vinyl alkyl ether adhesive, a silicone adhesive, a polyamide adhesive, or a urethane adhesive). In some examples, interface material 18 can be dielectric. In some examples, interface material 18 can be electrically conductive. Interface material 18 can be provided between substrate docks 115, 116, 117, 118 and lower docks 125, 126, 127, 128. Interface material 18 can couple cover sidewall 12 to substrate 11. In some examples, the vertical thickness of interface material 18 can range from about 1 μm to about 500 μm.

Figures 1, 2, 2G:
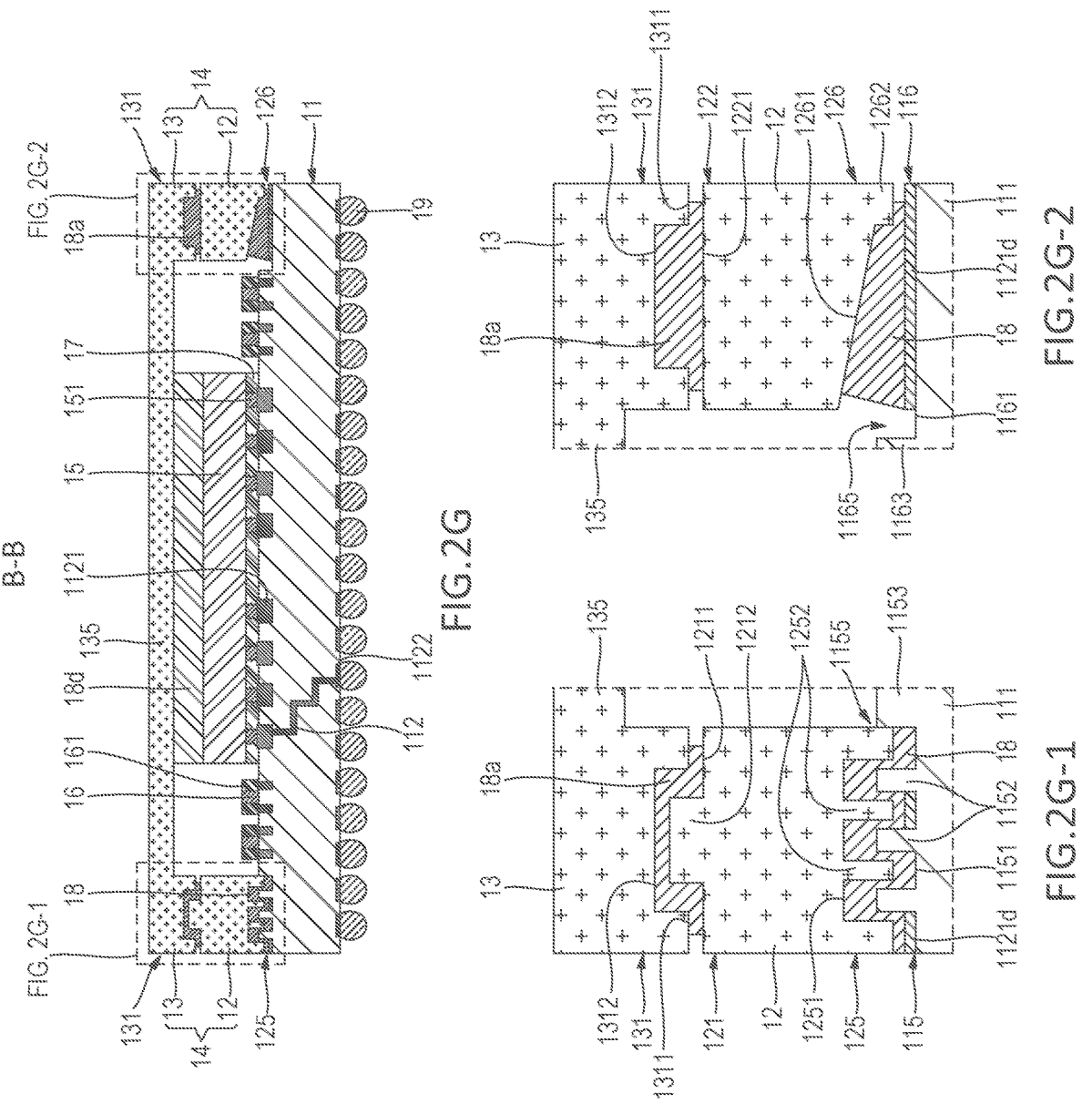

FIGS. 2G and 2H show cross-sectional views of electronic device 10 at a later stage of manufacture. FIG. 2G shows a cross-sectional view of electronic device 10 along line B-B in FIG. 1A. FIG. 2H shows a cross-sectional view of electronic device 10 along line C-C in FIG. 1A. FIG. 2G-1 shows the portion of electronic device 10 located in box 2G-1 in FIG. 2G. FIG. 2G-2 shows the portion of electronic device 10 located in box 2G-2 in FIG. 2G. FIG. 2H-1 shows the portion of electronic device 10 located in box 2H-1 in FIG. 2H. FIG. 2H-2 shows the portion of electronic device 10 located in box 2H-2 in FIG. 2H.

In accordance with various examples, cover lid 13 can be provided on cover sidewall 12. Cover lid 13 can be provided over substrate 11 to cover electronic components 15 and 16. In some examples, cover lid 13 can be coupled to cover sidewall 12 through upper interface material 18a. In some examples, cover lid 13 can be coupled to electronic component 15 through device interface material 18d. In some examples, upper interface material 18a can be provided on upper docks 121, 122, 123, and device interface material 18d can be provided on electronic component 15. Cover lid 13 can be seated on upper interface material 18a and device interface material 18d. Cover lid 13 can then be secured to cover sidewall 12 and electronic component 15 by curing or sintering upper interface material 18a and device interface material 18d. In some examples, cover sidewall 12 and cover lid 13 can be referred to as cover structure 14. In some examples, cover structure 14 can protect electronic components 15 and 16 from external elements or environmental exposure. In some examples, cover structure 14 can provide electromagnetic interference (EMI) shielding.

In some examples, cover lid 13 can comprise a material similar to cover sidewall 12. For example, cover lid 13 can comprise a metallic material such as copper, nickel, or steel. In some examples, the area (footprint) of cover lid 13 can correspond to the area of substrate 11. Cover lid 13 can comprise cover docks 131, 132 and lid roof 135. Cover docks 131, 132 can be provided along the perimeter or edge on the bottom or lower side of cover lid 13. In some examples, cover docks 131 and 132 can be coupled to each other (i.e., arranged consecutively) along the bottom perimeter of cover lid 13. In some examples, cover docks 131 and 132 can be spaced apart, or discontinuous, from each one another along the bottom perimeter of cover lid 13. In some examples, cover docks 131 and 132 can increase an area of contact with upper interface material 18a and can improve adhesion between cover lid 13 and cover sidewall 12. In some examples, dock conductors 1121d can be coupled to cover structure 14 through interface material 18, 18a.

With reference to FIG. 2G-1, cover dock 131 can comprise dock base 1311 and dock cavity 1312. In some examples, cover dock 131 can be coupled to upper dock 121 of cover sidewall 12. Dock cavity 1312 can be provided in (e.g., extend upwardly into) dock base 1311. Dock cavity 1312 can receive dock protrusion 1212 of cover sidewall 12. Upper interface material 18a can be provided in dock cavity 1312 and around dock protrusion 1212 and/or between dock base 1311 and dock base 1211. In some examples, dock cavity 1312 can be provided by removing a portion of cover lid 13 by punching, etching, milling, or laser. In some examples, the vertical thickness (or depth) of dock cavity 1312 can range from about 1 μm to about 100 μm, or the width of dock cavity 1312 can range from about 10 μm to about 5000 μm.

With reference to FIG. 2G-2, in some examples, cover dock 131 can be coupled to upper dock 121 of cover sidewall 12. Upper interface material 18a can be provided in dock cavity 1312 and/or between dock base 1311 and dock base 1221. The sidewalls of dock cavity 1312 may restrict flow of upper interface material 18a.

With reference to FIG. 2H-1, cover dock 132 can comprise dock base 1321 and dock protrusions 1322. In some examples, cover dock 132 can be coupled to upper dock 122 of cover sidewall 12. In some examples, dock base 1321 can be referred to as a bottom or lower portion of cover lid 13. Dock protrusions 1322 can downwardly protrude from dock base 1321. One or more dock protrusion(s) 1322 can be provided on dock base 1321. Upper interface material 18a can be provided between dock protrusions 1322 and dock base 1221 and/or between dock base 1321 and dock base 1221. In some examples, dock protrusions 1322 can be provided by removing a portion of cover lid 13 by punching, etching, milling or laser. In some examples, the vertical thickness of dock protrusions 1322 can range from about 1 μm to about 100 μm. The pitch of dock protrusions 1322 can range from about 10 μm to about 500 μm.

With reference to FIG. 2H-2, in some examples, cover dock 132 can be coupled to upper dock 123 of cover sidewall 12. In some examples, dock protrusions 1232 of cover sidewall 12 can be located, or interleaved, between dock protrusions 1322. Upper interface material 18a can be provided between dock protrusions 1322 and dock protrusions 1232, and/or between dock protrusions 1322 and dock base 1221, and/or between dock base 1321 and dock protrusions 1232.

Returning to FIGS. 2G and 2H, lid roof 135 can cover the entire top side of substrate 11 and electronic components 15 and 16 on substrate 11. In some examples, lid roof 135 can couple cover docks 131 and 132 to each other (e.g., lid roof 135 can extend between cover dock 131 and cover dock 132). Lid roof 135 can be adhered, or coupled, to electronic component 15 through device interface material 18d. In some examples, the vertical thickness of lid roof 135 can range from about 10 μm to about 5000 μm.

Figures 3A, 3B:
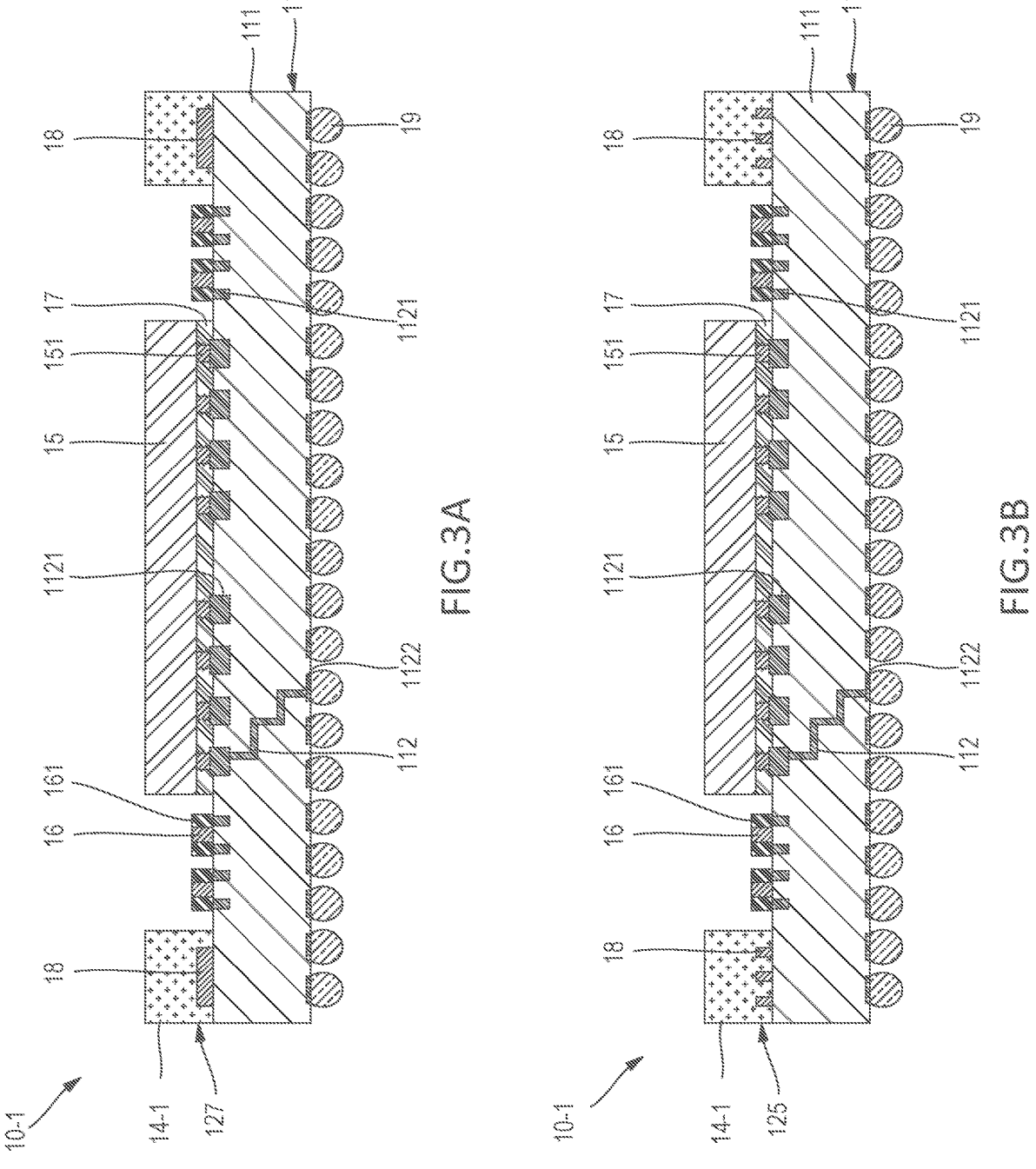
FIGS. 3A and 3B show cross-sectional views of an example electronic device.

FIGS. 3A and 3B show cross-sectional views of an example electronic device 10-1. The cross-section view of FIG. 3A is taken along line B-B in FIG. 1A. The cross-section view of FIG. 3B is taken along line C-C in FIG. 1A. In the example shown in FIGS. 3A and 3B, electronic device 10-1 can comprise substrate 11, cover structure 14-1, electronic components 15 and 16, underfill 17, interface material 18, and external interconnects 19. Electronic device 10-1 can comprise similar elements, features, materials, or formation processes to those of electronic device 10, as previously described.

In the example shown in FIGS. 3A and 3B, cover structure 14-1 can be similar to, or can comprise corresponding features of, cover sidewall 12. Electronic components 15 and 16 can be exposed at the top side of substrate 11. Cover structure 14-1 can comprise one or more lower docks, such as lower dock 125 or lower dock 127. While FIGS. 3A and 3B show cover structure 14-1 including lower dock 125 and lower dock 127, it is contemplated and understood that cover structure 14-1 can include any one of lower docks 125, 126, 127, 128 or any combination of lower docks 125, 126, 127,

128. Cover structure 14-1 can be coupled to substrate 11 by interface material 18 located between lower docks 125, 127 and substrate 11. While FIGS. 3A and 3B show the upper side of substrate 11 provided without substrate docks 115, 116, 117, 118, it is contemplated and understood that cover structure 14-1 can be coupled to a substrate 11 that includes any one or combination of substrate docks 115, 116, 117, 118.

Figures 4A, 4B:
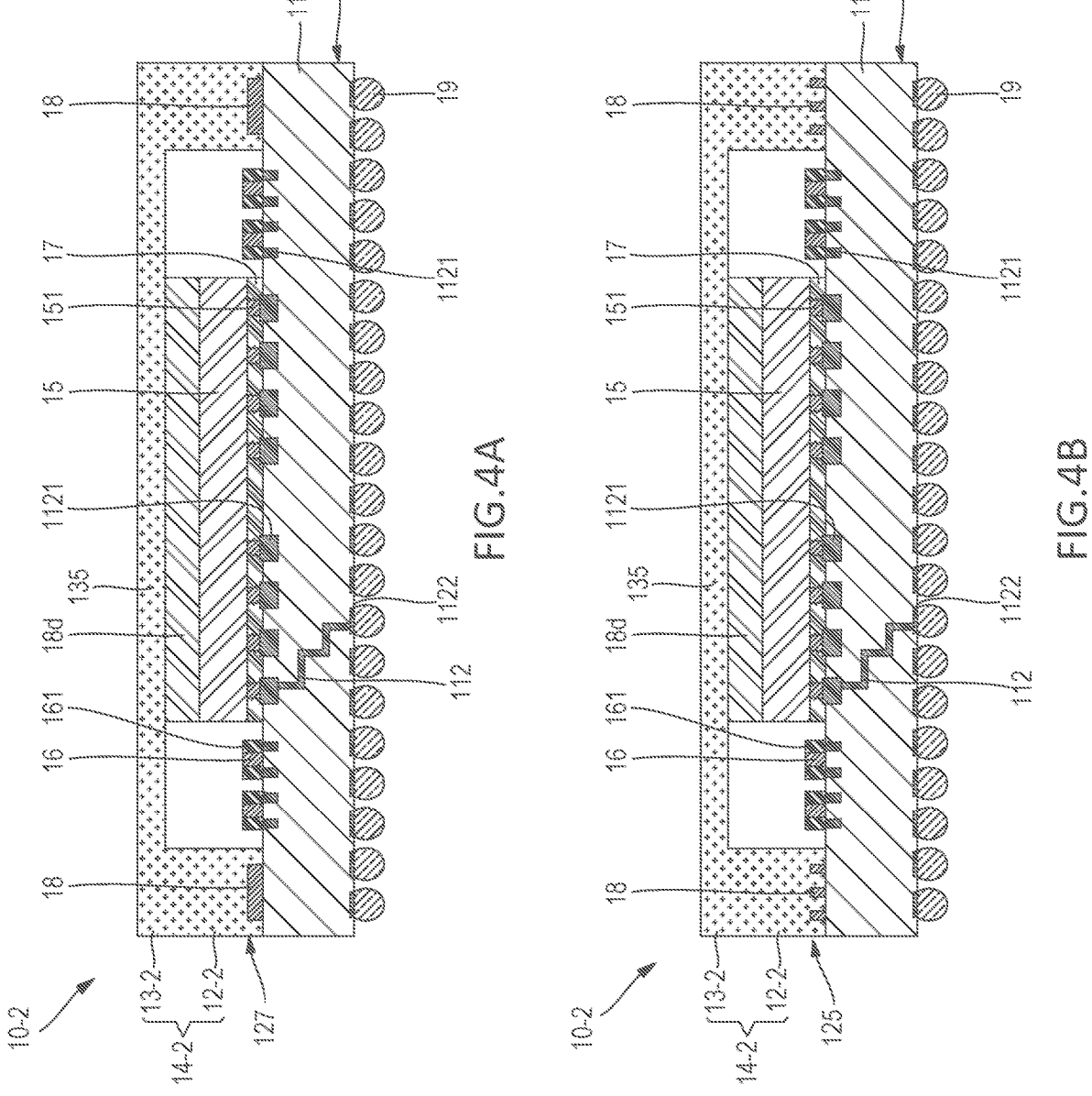
FIGS. 4A and 4B show cross-sectional views of an example electronic device.

FIGS. 4A and 4B show cross-sectional views of an example electronic device 10-2. The cross-section view of FIG. 4A is taken along line B-B in FIG. 1A. The cross-section view of FIG. 4B is taken along line C-C in FIG. 1A. In the example shown in FIGS. 4A and 4B, electronic device 10-2 can comprise substrate 11, cover structure 14-2, electronic components 15 and 16, underfill 17, interface material 18, device interface material 18d, and external interconnects 19. Electronic device 10-2 can comprise elements, features, materials, or formation processes similar to those of electronic device 10, as previously described.

In the example shown in FIGS. 4A and 4B, cover structure 14-2 can comprise cover sidewall 12-2 and cover lid 13-2, which can be similar to cover sidewall 12 and cover lid 13, respectively, but can comprise a single, integral piece rather than a cover lid that is separate and discrete from the cover sidewall. Cover sidewall 12-2 can comprise one or more lower docks, such as lower dock 125 or lower dock 127. While FIGS. 4A and 4B show cover sidewall 12-2 including lower dock 125 and lower dock 127, it is contemplated and understood that cover sidewall 12-2 of cover structure 14-2 can include any one of lower docks 125, 126, 127, 128 or any combination of lower docks 125, 126, 127, 128.

Cover sidewall 12-2 of cover structure 14-2 can be coupled to substrate 11 by interface material 18 located between lower docks 125, 127 and substrate 11. While FIGS. 4A and 4B show the upper side of substrate 11 provided without substrate docks 115, 116, 117, 118, it is contemplated and understood that cover structure 14-2 can be coupled to a substrate 11 that includes any one or combination of substrate docks 115, 116, 117, 118.

Figures 5A, 5B:
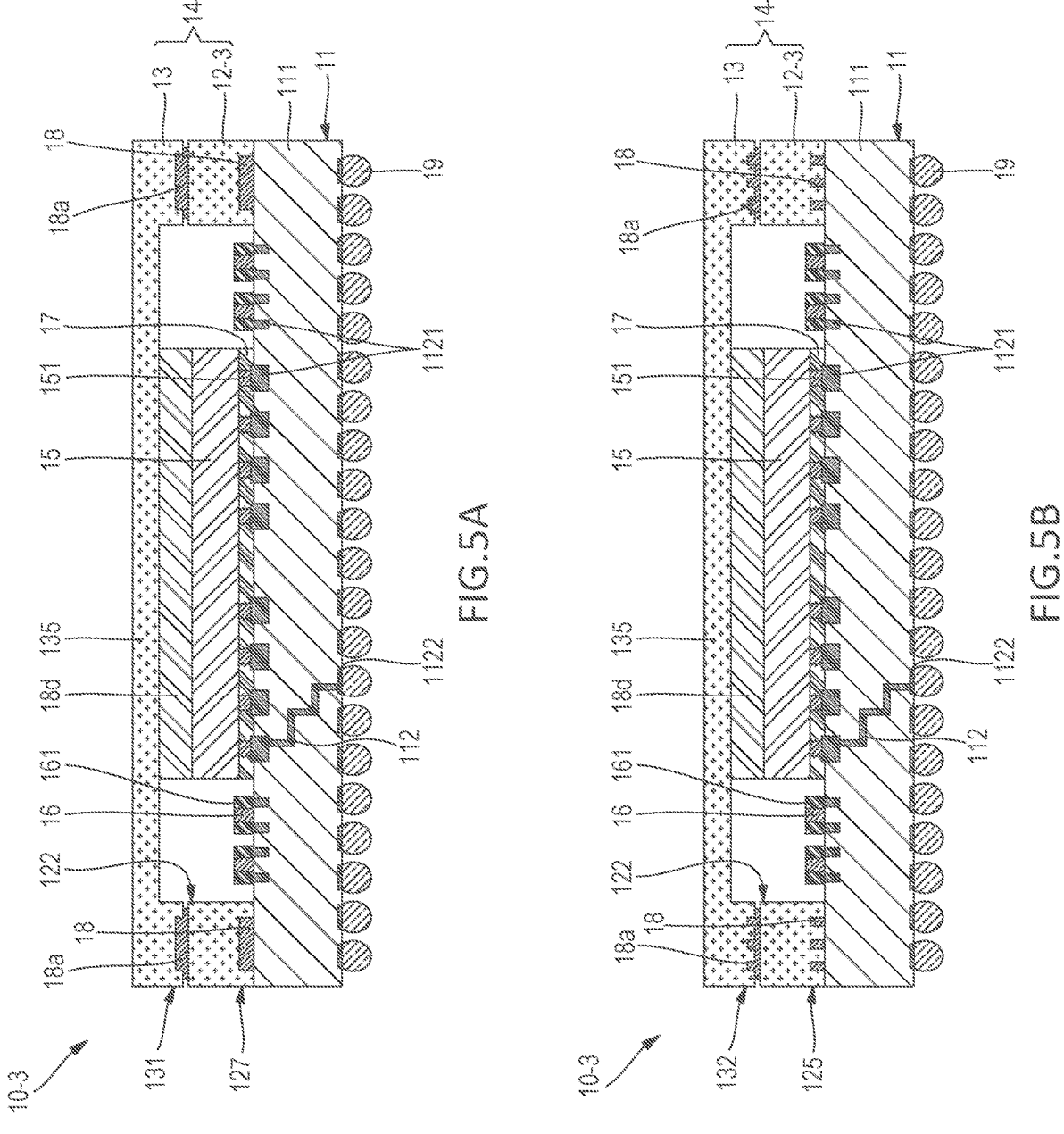
FIGS. 5A and 5B show cross-sectional views of an example electronic device.

FIGS. 5A and 5B show cross-sectional views of an example electronic device 10-3. The cross-section view of FIG. 5A is taken along line B-B in FIG. 1A. The cross-section view of FIG. 5B is taken along line C-C in FIG. 1A. In the example shown in FIGS. 5A and 5B, electronic device 10-3 can comprise substrate 11, cover structure 14-3, electronic components 15 and 16, underfill 17, interface material 18, upper interface material 18a, device interface material 18d, and external interconnects 19. Cover structure 14-3 can comprise cover lid 13 and cover sidewall 12-3

In the example shown in FIGS. 5A and 5B, cover sidewall 12-3 can comprise one or more lower docks, such as lower dock 125 or lower dock 127, and one or more upper docks, such as upper dock 122. While FIGS. 5A and 5B show cover sidewall 12-3 including lower dock 125 and 127 and upper dock 122, it is contemplated and understood that cover sidewall 12-3 of cover structure 14-3 can include any one or combination of lower docks 125, 126, 127, 128 and/or any or combination of upper lower docks 121, 122, 123. Cover lid 13 can comprise one or more of docks 131 or 132, and lid roof 135. While FIGS. 5A and 5B show the upper side of substrate 11 provided without substrate docks 115, 116, 117, 118, it is contemplated and understood that cover sidewall 12-3 of cover structure 14-3 can be coupled to a substrate 11 that includes any one or combination of substrate docks 115, 116, 117, 118.

Figures 6A, 6B:
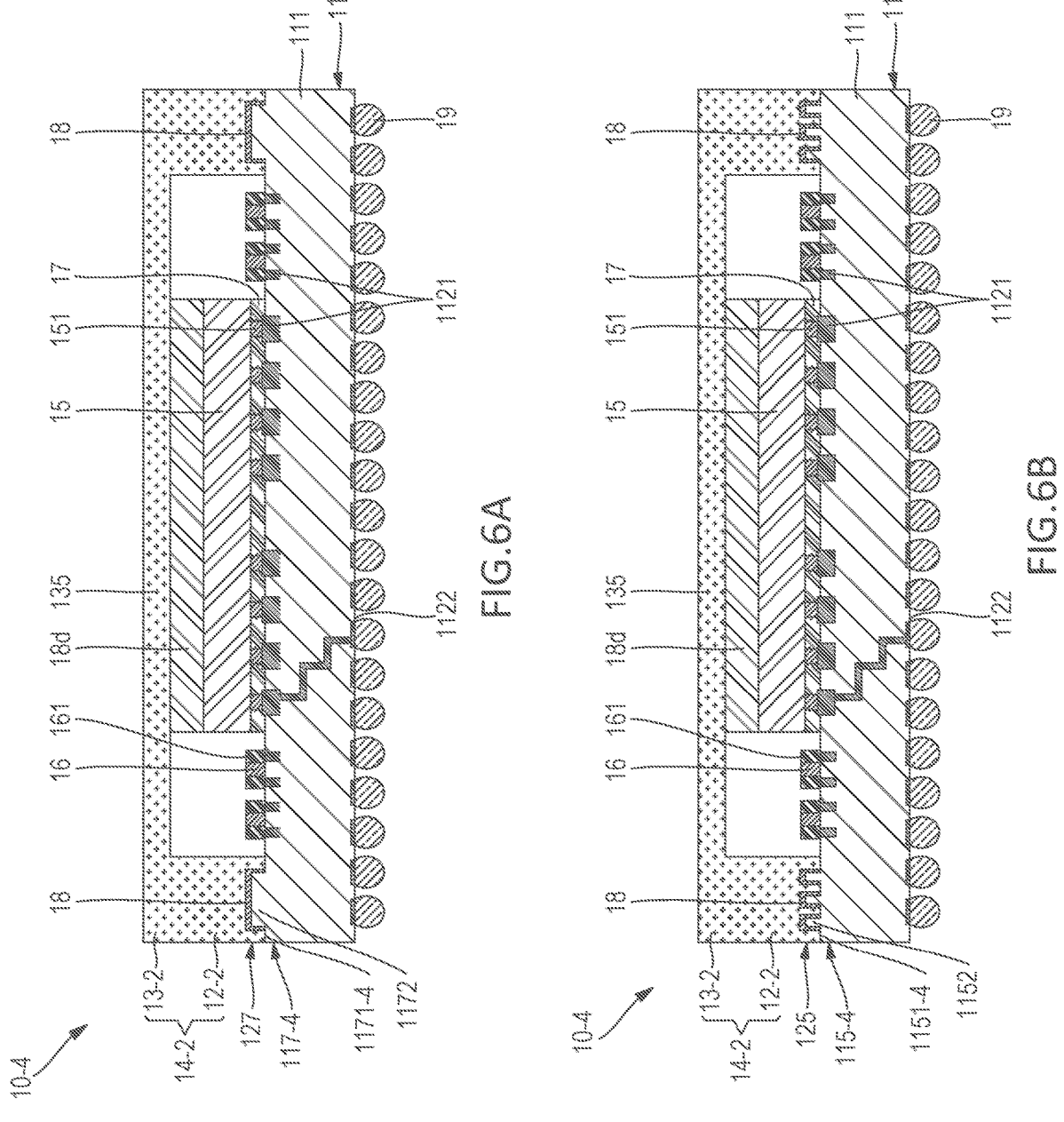
FIGS. 6A and 6B show cross-sectional views of an example electronic device.
Figures 7A, 7B:
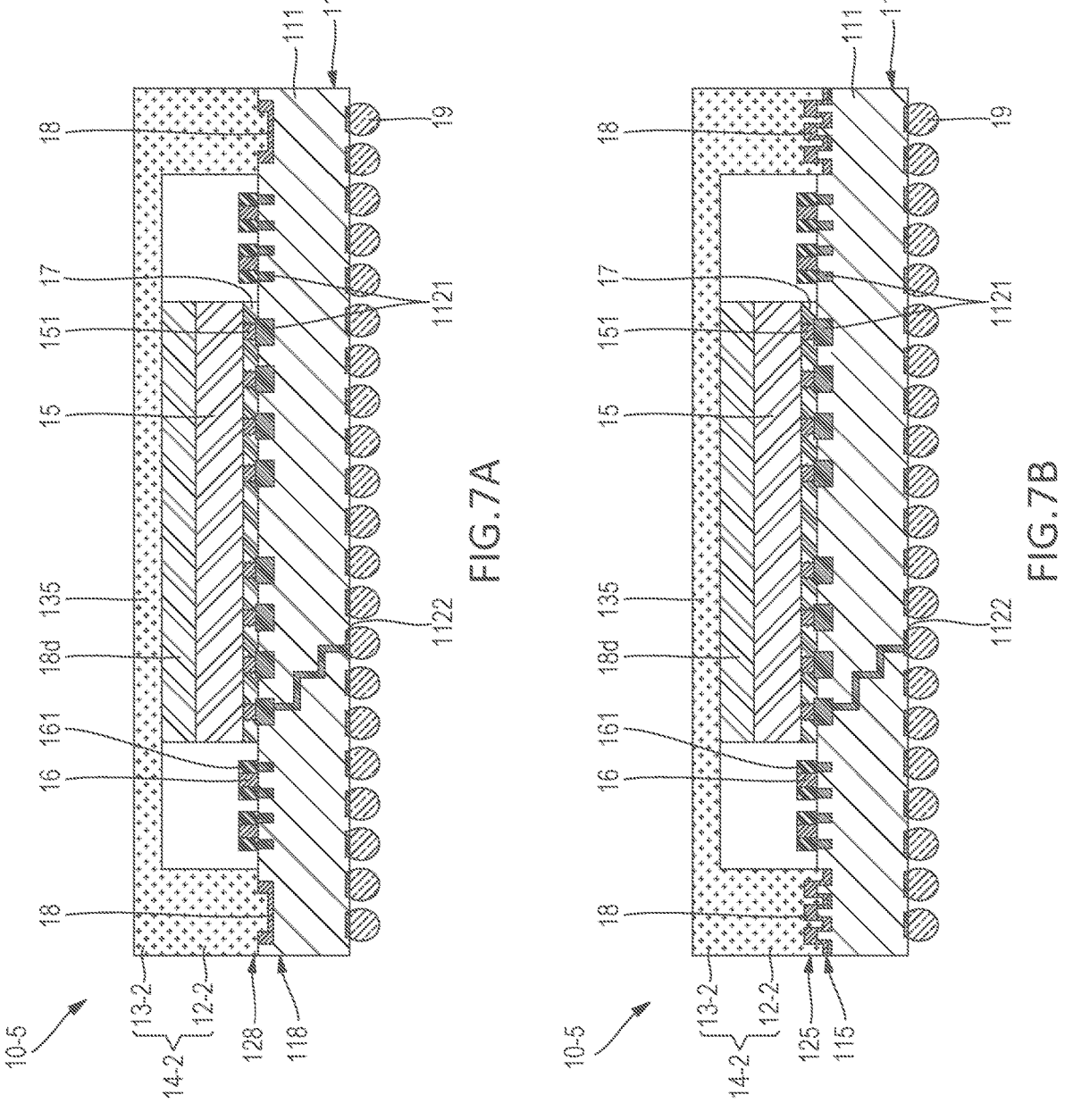
FIGS. 7A, 7B, 7C, and 7D show cross-sectional views of an example electronic device.
Figures 7C, 7D:
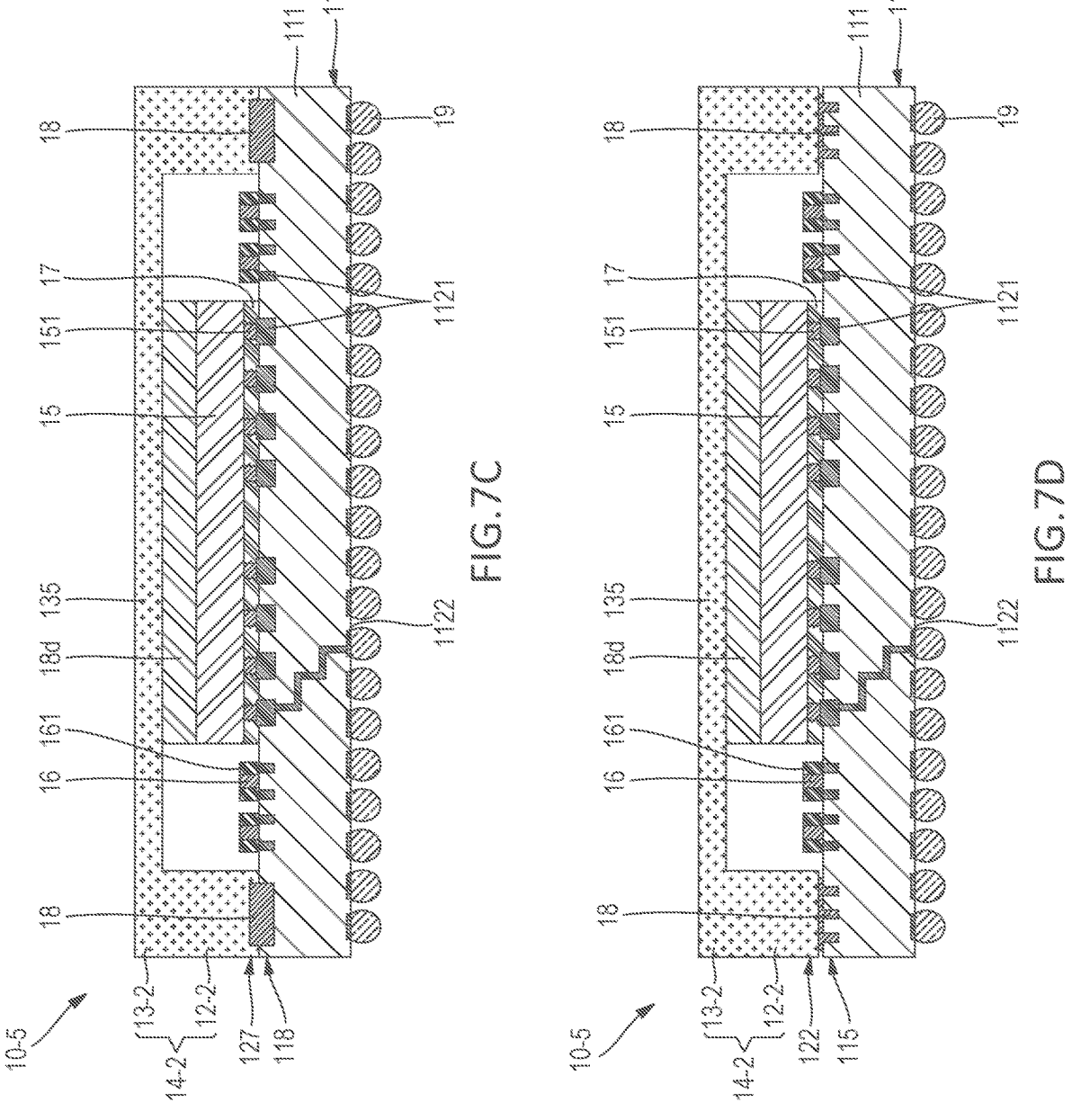

FIGS. 6A and 6B show cross-sectional views of an example electronic device 10-4. The cross-section view of FIG. 6A is taken along line B-B in FIG. 1A. The cross-section view of FIG. 6B is taken along line C-C in FIG. 1A. In the example shown in FIGS. 6A and 6B, electronic device 10-4 can comprise substrate 11, cover structure 14-2, electronic components 15 and 16, underfill 17, interface material 18, device interface material 18*d*, and external interconnects 19.

In the example shown in FIGS. 6A and 6B, substrate 11 can comprise dielectric structure 111, conductive structure 112, and substrate docks 115-4 and 117-4. Substrate docks 115-4, 117-4 can be similar to substrate docks 115, 117, but need not comprise cavity 1155, 1175 (FIG. 2E-1, 2F-1). Instead, substrate docks 115-4, 117-4 can comprise dock protrusions 1152, 1172 protruding from dock bases 1151-4, 1171-4 that are at or coplanar with the top or upper side of substrate 11. Cover structure 14-2 can be as described with respect to FIGS. 4A and 4B. The lower docks (e.g., lower docks 125, 127) of cover sidewall 12-2 can be coupled to substrate docks 115-4, 117-4 by interface material 18.

FIGS. 7A, 7B, 7C, and 7D show cross-sectional views of an example electronic device 10-5. In the example shown in FIGS. 7A to 7D, electronic device 10-5 can comprise substrate 11, cover structure 14-2, electronic components 15 and 16, underfill 17, interface material 18, device interface material 18*d*, and external interconnects 19.

Cover structure 14-2 can comprise lower docks similar to, or the same as, lower docks 125, 126, 127, 128 as described above. In some examples, cover sidewall 12-2 can comprise a lower dock having a shape/design similar to upper dock 122 (e.g., a dock with a planar dock base oriented toward substrate 11). Substrate 11 can comprise dielectric structure 111, conductive structure 112, and substrate docks such as substrate docks 115, 116, 117 118. While FIGS. 7A to 7D show substrate 11 including substrate dock 115 and 118, it is contemplated and understood that substrate 11 can include any one or combination of substrate docks 115, 116, 117, 118. The lower docks 125, 127 of cover structure 14-2 can be coupled by interface material 18 to the substrate docks 115, 118 of substrate 11.

Figures 8, 9:
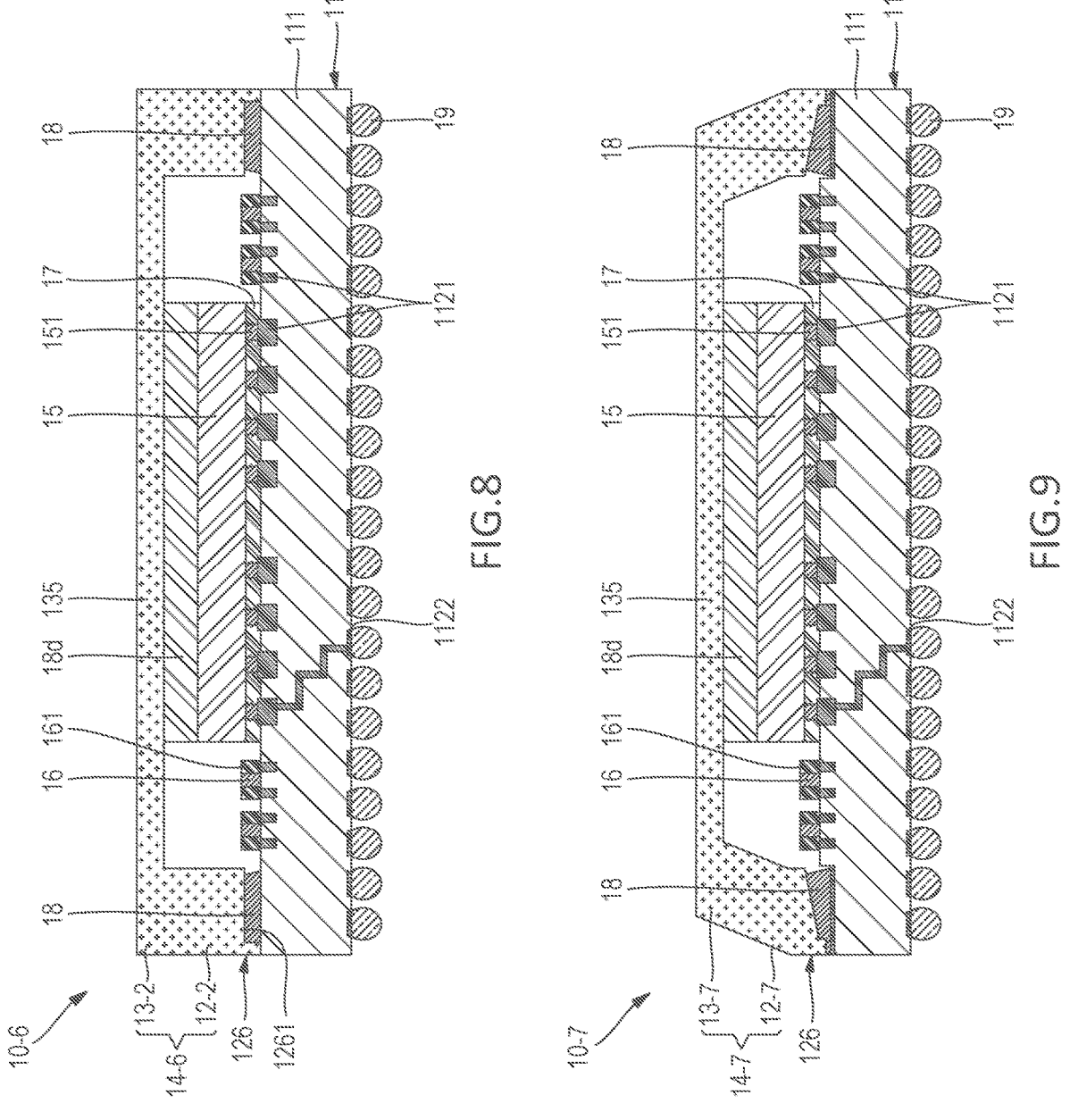
FIG. 8 shows a cross-sectional view of an example electronic device.
FIG. 9 shows a cross-sectional view of an example electronic device.

FIG. 8 shows a cross-sectional view of an example electronic device 10-6. In the example shown in FIG. 8, electronic device 10-6 can comprise substrate 11, cover structure 14-6, electronic components 15 and 16, underfill 17, interface material 18, device interface material 18*d*, and external interconnects 19.

In accordance with various examples, cover structure 14-6 can be similar to cover structure 14-2 (FIGS. 4A and 4B) and can comprise lower dock 126. Lower dock 126 can comprise dock base 1221, with a substantially planar surface, and dock protrusion 1262 protruding from dock base dock base 1261. In some examples, dock base 1221 can be a roughened surface. Interface material 18 can couple lower dock 126 to substrate 11.

FIG. 9 shows a cross-sectional view of an example electronic device 10-7. In the example shown in FIG. 9, electronic device 10-7 can comprise substrate 11, cover structure 14-7, electronic components 15 and 16, underfill 17, interface material 18, device interface material 18*d*, and external interconnects 19.

In the example shown in FIG. 9, cover structure 14-7 can be similar to cover structure 14-6 (FIG. 8) and can comprise cover lid 13-7 and cover wall 12-7. In various examples, cover wall 12-7 can be inclined or oblique relative to cover lid 13-7 and substrate 11. Cover wall 12-7 can comprise dock 126 coupled to substrate dock 116 by interface material 18, as described above with respect to FIG. 2E.

The present disclosure includes reference to certain examples; however, it will be understood by those skilled in the art that various changes may be made, and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:
   a substrate comprising:
      a substrate first side;
      a substrate second side opposite to the substrate first side;
      a substrate lateral side connecting the substrate first side to the substrate second side;
      a dielectric structure; and
      a conductive structure;
   a substrate dock comprising:
      a substrate dock base at the substrate first side; and
      a first substrate dock sidewall extending upward from the substrate dock base, the substrate dock base and the first substrate dock sidewall defining a substrate dock cavity;
   a cover structure comprising:
      a cover sidewall comprising:
         a cover sidewall lower side;
         a cover sidewall upper side opposite to the cover sidewall lower side;
         a lower dock at the cover sidewall lower side; and
         an upper dock at the cover sidewall upper side; and
      a cover lid comprising a cover dock and a lid roof, wherein the cover dock is along a bottom perimeter of the lid roof;
   a first interface material coupling the lower dock to the substrate dock;
   a second interface material coupling the upper dock to the cover dock; and
   an electronic component coupled to the conductive structure.

2. The electronic device of claim 1, further comprising:
   a dock conductor on the substrate dock base.

3. The electronic device of claim 1, wherein:
   the substrate dock further comprises substrate dock protrusions extending upward from the substrate dock base.

4. The electronic device of claim 1, wherein:
   the substrate comprises an edge at the substrate lateral side;
   the substrate dock further comprises a second substrate dock sidewall proximate to the edge; and
   the first substrate dock sidewall is laterally spaced inward from the second substrate dock sidewall.

5. The electronic device of claim 1, wherein the lower dock comprises:
   a lower dock base; and
   one or more of a lower dock protrusion or a lower dock cavity.

6. The electronic device of claim 5, wherein:
   the cover sidewall comprises a vertical thickness, an outer wall, and an inner wall opposite to the outer wall,
   the outer wall is proximate to the substrate lateral side;
   the lower dock base is inclined such that the vertical thickness increases between the inner wall and the outer wall; and the lower dock comprises a protrusion proximate to the outer wall.

7. The electronic device of claim 1, wherein:

the substrate dock further comprises substrate dock protrusions extending upward from the substrate dock base;

the lower dock comprises a lower dock base and lower dock protrusions extending downward from the lower dock base; and the lower dock protrusions are interleaved with the substrate dock protrusions.

8. The electronic device of claim 1, wherein:

the upper dock comprises:

an upper dock base; and upper dock protrusions extending upward from the upper dock base.

9. The electronic device of claim 8, wherein:

the cover dock comprises:

a cover dock base; and cover dock protrusions extending downward from the cover dock base; and the upper dock protrusions are interleaved with the cover dock protrusions.

10. The electronic device of claim 2, wherein:

the dock conductor is on a first portion of the substrate dock base; and a second portion of the substrate dock base is devoid of the dock conductor.

11. An electronic device, comprising:

a substrate comprising:

a substrate first side;

a substrate second side opposite to the substrate first side; and a substrate lateral side connecting the substrate first side to the substrate second side;

a substrate dock at the substrate first side proximate to the substrate lateral side;

a cover structure comprising:

a cover sidewall comprising a cover sidewall lower side; and a lower dock at the cover sidewall lower side;

an interface material coupling the lower dock to the substrate dock so that the lower dock and the substrate dock overlap in a vertical direction; and an electronic component coupled to the substrate first side, wherein:

the substrate dock comprises a substrate dock base and substrate dock protrusions extending upward from the substrate dock base;

the lower dock comprises a lower dock base and lower dock protrusions extending downward from the lower dock base; and the lower dock protrusions are interleaved with the substrate dock protrusions.

12. The electronic device of claim 11, wherein:

the lower dock is continuous along the cover sidewall lower side.

13. The electronic device of claim 11, further comprising:

a dock conductor is over the substrate dock base between the substrate dock protrusions.

14. The electronic device of claim 11, wherein:

the substrate dock comprises a substrate dock cavity extending inward from the substrate first side to the substrate dock base so that the substrate dock base is located below the substrate first side.

15. The electronic device of claim 11, wherein:

the substrate dock is continuous along an edge of the substrate.

16. The electronic device of claim 11, wherein:

the cover structure comprises a cover lid; and the cover sidewall comprises an upper dock coupled to the cover lid.

17. The electronic device of claim 16, wherein:

the upper dock comprises an upper dock base and an upper dock protrusion.

18. A method of manufacturing an electronic device, comprising:

providing a substrate comprising:

a substrate first side;

a substrate second side opposite to the substrate first side;

a substrate lateral side connecting the substrate first side to the substrate second side; and a substrate dock at the substrate first side proximate to the substrate lateral side;

providing a cover structure comprising:

a cover sidewall comprising a cover sidewall lower side; and a lower dock at the cover sidewall lower side;

coupling the lower dock and the substrate dock with an interface material so that the lower dock and the substrate dock overlap in a vertical direction; and coupling an electronic component to the substrate first side, wherein:

providing the substrate comprises providing the substrate dock comprising a substrate dock base and substrate dock protrusions extending upward from the substrate dock base;

providing the cover structure comprises providing the lower dock comprising a lower dock base and lower dock protrusions extending downward from the lower dock base; and coupling the lower dock and the substrate dock comprises interleaving the lower dock protrusions with the substrate dock protrusions.

19. The method of claim 18, further comprising:

providing a dock conductor over the substrate dock base.

20. The method of claim 18, wherein:

providing the substrate comprises providing the substrate dock comprising substrate dock cavity extending inward from the substrate first side;

providing the cover structure comprises providing the lower dock comprising a lower dock protrusion; and coupling the lower dock and the substrate dock comprising disposing within the substrate dock cavity.

\* \* \* \* \*